(12) United States Patent
Chu et al.

(10) Patent No.: US 11,367,638 B2
(45) Date of Patent: Jun. 21, 2022

(54) LOAD PORT

(71) Applicant: E&R ENGINEERING CORPORATION, Kaohsiung (TW)

(72) Inventors: Yu-Min Chu, Kaohsiung (TW); Cho-Chun Chung, Kaohsiung (TW); Chia-Hsiu Huang, Kaohsiung (TW)

(73) Assignee: E&R ENGINEERING CORPORATION, Kaohsiung (TW)

( * ) Notice: Subject to any disclaimer, the term of this patent is extended or adjusted under 35 U.S.C. 154(b) by 253 days.

(21) Appl. No.: 16/907,530

(22) Filed: Jun. 22, 2020

(65) Prior Publication Data

US 2021/0351052 A1 Nov. 11, 2021

(30) Foreign Application Priority Data

May 7, 2020 (TW) ................................ 109205496

(51) Int. Cl.
*H01L 21/67* (2006.01)
*H01L 21/677* (2006.01)
*G01L 5/00* (2006.01)

(52) U.S. Cl.
CPC .......... *H01L 21/67265* (2013.01); *G01L 5/00* (2013.01); *H01L 21/67775* (2013.01); *H01L 21/67769* (2013.01)

(58) Field of Classification Search
CPC ......... H01L 21/67265; H01L 21/67775; H01L 21/67769; H01L 21/67379; H01L 21/67772

See application file for complete search history.

(56) References Cited

U.S. PATENT DOCUMENTS

| | | | | |
|---|---|---|---|---|
| 9,171,748 | B2* | 10/2015 | Hatano | H01L 21/67775 |
| 2003/0107011 | A1* | 6/2003 | Meyhofer | H01L 21/67265 |
| | | | | 250/559.4 |
| 2008/0056860 | A1* | 3/2008 | Natume | H01L 21/67769 |
| | | | | 414/673 |
| 2011/0303125 | A1* | 12/2011 | Itou | H01L 21/67775 |
| | | | | 108/42 |
| 2012/0067770 | A1* | 3/2012 | Hatano | H01L 21/67379 |
| | | | | 206/710 |
| 2019/0067040 | A1* | 2/2019 | Kuo | H01L 21/677 |
| 2019/0105770 | A1* | 4/2019 | Plaisted | B25J 9/107 |
| 2020/0098604 | A1* | 3/2020 | Sugimoto | B65G 47/90 |
| 2020/0185241 | A1* | 6/2020 | Kunitake | H01L 22/12 |
| 2021/0215752 | A1* | 7/2021 | Ito | G06K 17/0022 |

* cited by examiner

*Primary Examiner* — Mamadou L Diallo
(74) *Attorney, Agent, or Firm* — Birch, Stewart, Kolasch & Birch, LLP

(57) ABSTRACT

A load port adapted for wafer cassettes of different sizes detects storage states of wafers stored in the wafer cassettes. The load port includes a body, a positioning mechanism, a sensing mechanism, and a detecting mechanism. The body has a carrier base. The positioning mechanism is disposed on the body and has a positioning unit disposed on the carrier base, a hooking unit, and a limiting unit. The hooking unit is disposed in the body and has a driving assembly and a hooking element. The driving assembly is disposed in the body. The hooking element is mounted to the driving assembly. The sensing mechanism is disposed on the carrier base. The detecting mechanism is disposed on the body, detects the storage states of wafers stored in the wafer cassette, and has a first detecting assembly and a second detecting assembly spaced apart from each other.

20 Claims, 28 Drawing Sheets

LOAD PORT

BACKGROUND OF THE INVENTION

1. Field of the Invention

The present invention relates to a load port, and more particularly to a load port adapted for wafer cassettes of different sizes.

2. Description of Related Art

Wafers are available in a variety of sizes and should be accommodated in a wafer cassette that suit the wafers. Therefore, wafer cassettes also come in different sizes. However, a conventional load port can only be adapted for wafer cassettes of the same size. In other words, the conventional load port cannot be adapted for wafer cassettes of different sizes. That is, the conventional load port lacks practicality and is unable to meet the requirements of industry.

To overcome the shortcomings of the conventional load port, the present invention tends to provide a load port to mitigate or obviate the aforementioned problems.

SUMMARY OF THE INVENTION

The main objective of the present invention is to provide a load port adapted for wafer cassettes of different sizes and being capable of detecting storage states of wafers stored in the wafer cassettes.

The load port includes a body, a positioning mechanism, a sensing mechanism, and a detecting mechanism. The body has a carrier base onto which a wafer cassette is loaded. The carrier base has a slide groove formed through the carrier base. The positioning mechanism is disposed on the body, positions the wafer cassette loaded onto the carrier base, and has a positioning unit, a hooking unit, and a limiting unit. The positioning unit is disposed on the carrier base of the body and has three positioning protrusions protruding out of a top surface of the carrier base. The hooking unit is disposed in the body and has a driving assembly and a hooking element. The driving assembly is disposed in the body. The hooking element is mounted to the driving assembly. The driving assembly drives the hooking element to extend out of the slide groove of the carrier base. The limiting unit is disposed on the top surface of the carrier base. The sensing mechanism is disposed on the carrier base of the body.

The detecting mechanism is disposed on the body, is on a side of the carrier base of the body, detects storage states of wafers stored in the wafer cassette, and has a first detecting assembly and a second detecting assembly. The first detecting assembly is disposed on the body and has a first driving element, a first L-shaped lever arm, a first transmission element, and a first detecting unit. The first driving element is disposed on the body. The first L-shaped lever arm is pivotally connected to the body. The first transmission element is disposed on the body and is connected to the first driving element and the first L-shaped lever arm. The first detecting unit is disposed on the first driving element and has two first detecting portions being spaced apart from each other. The second detecting assembly is disposed on the body, is located opposite to the first detecting assembly and has a second driving element, a second L-shaped lever arm, a second transmission element, and a second detecting unit. The second driving element is disposed on the body. The second L-shaped lever arm is pivotally connected to the body. The second transmission element is disposed on the body and is connected to the second driving element and the second L-shaped lever arm. The second detecting unit is disposed on the second driving element and has two second detecting portions being spaced apart from each other. A distance between the two first detecting portions is smaller than a distance between the two second detecting portions.

Other objectives, advantages and novel features of the invention will become more apparent from the following detailed description when taken in conjunction with the accompanying drawings.

DETAILED DESCRIPTION OF THE PREFERRED EMBODIMENT

Figure 5:
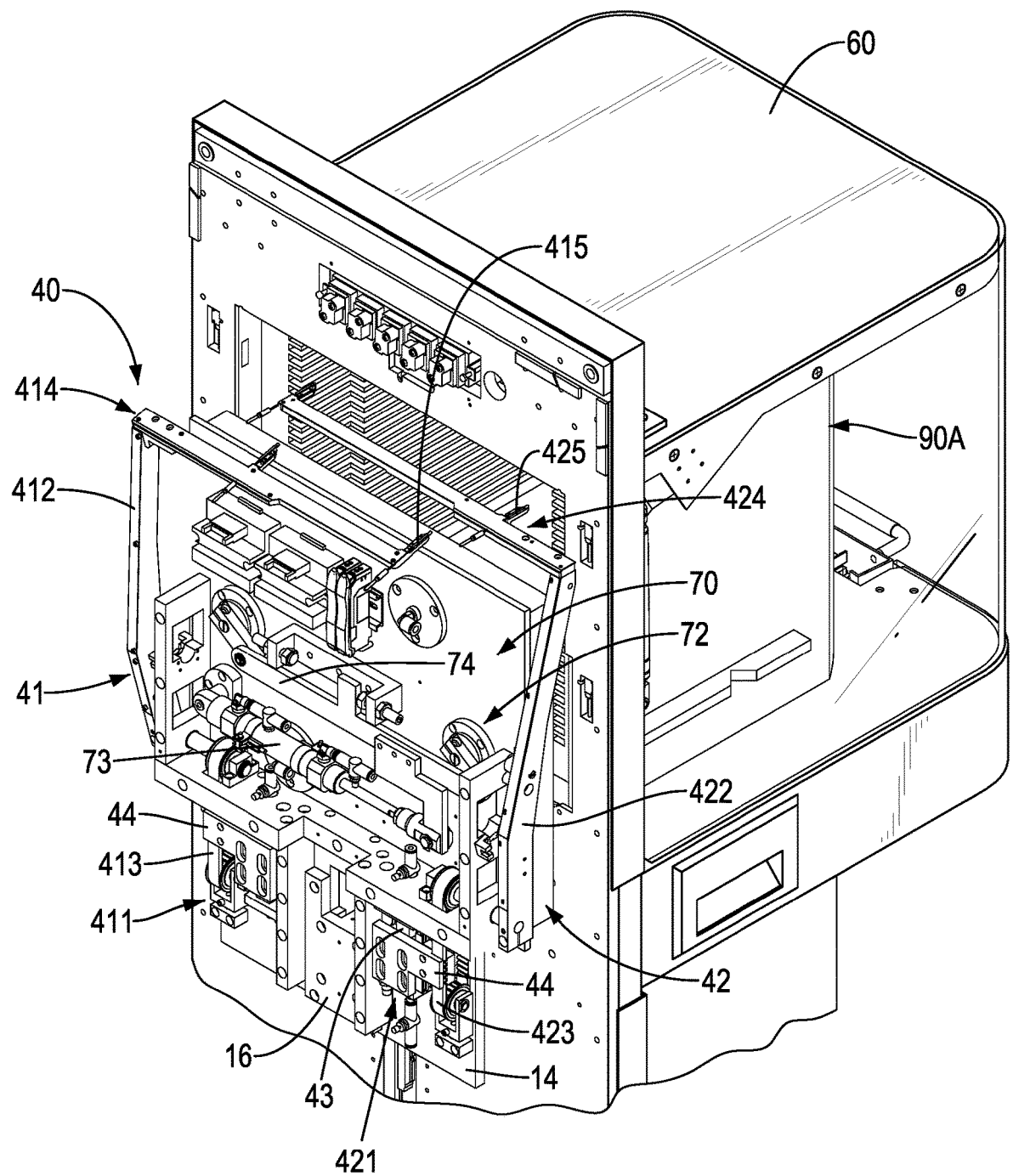
FIG. 5 is an enlarged perspective view of the load port in FIG. 2, shown with a door of the first-type wafer cassette detached.

With reference to FIGS. 1, 2, and 14 to 28, a load port in accordance with the present invention is adapted for wafer cassettes of different sizes and can detect storage states of wafers stored in the wafer cassettes. With reference to FIGS. 5 to 7, a load port in accordance with the present invention includes a body 10, a positioning mechanism 20, a sensing mechanism 30, and a detecting mechanism 40.

Figures 6A, 6B:
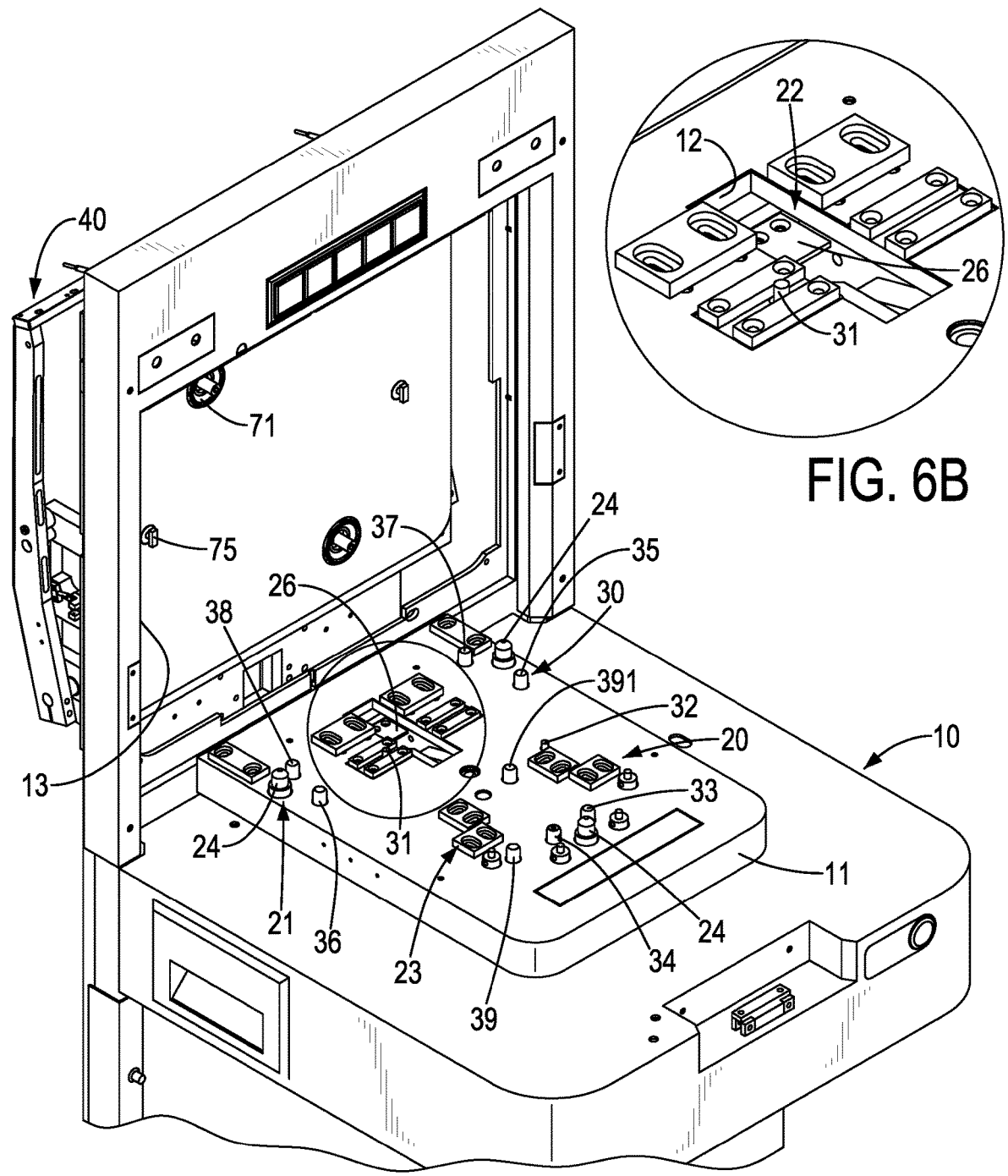
FIG. 6A is an enlarged perspective view of the load port in FIG. 1, shown with both the lid and the first-type wafer cassette detached from the load port.
FIG. 6B is an enlarged perspective view of a slide groove of a carrier base and a hooking unit of the load port in FIG. 1.
Figure 7:
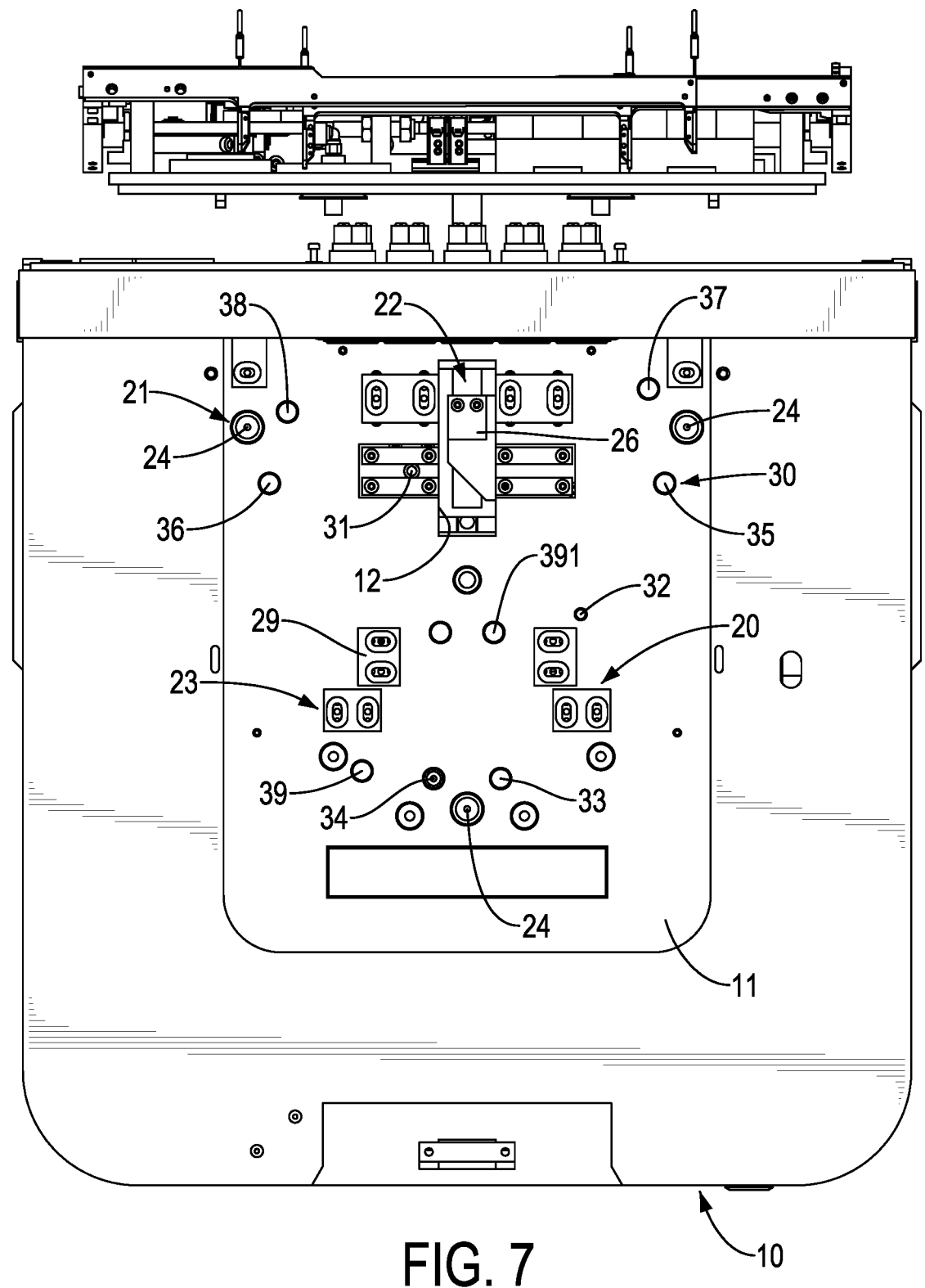
FIG. 7 is a top side view of the load port in FIG. 6A.

With reference to FIGS. 6A, 6B, and 7, the body 10 has a carrier base 11. The carrier base 11, onto which a wafer cassette is loaded, is disposed on a top surface of the body 10 and has a slide groove 12. The slide groove 12 is formed through the carrier base 11.

Figure 12:
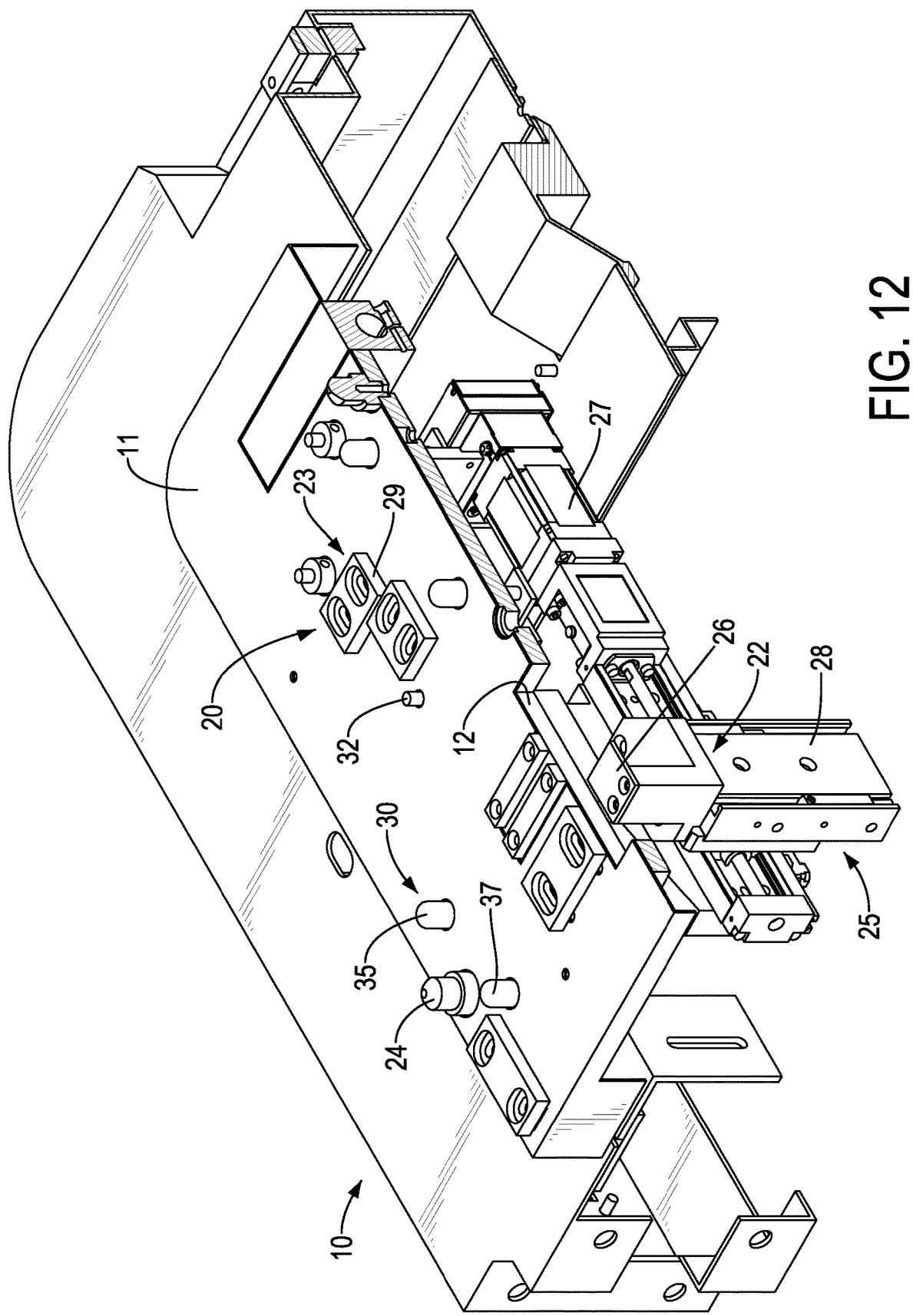
FIG. 12 is an enlarged perspective cross-sectional view of a body and a positioning mechanism of the load port in FIG. 2.

With reference to FIGS. 6A and 7, the positioning mechanism 20 is disposed on the body 10, and the positioning mechanism 20 positions the wafer cassette loaded onto the carrier base 11 of the body 10. The positioning mechanism 20 has a positioning unit 21, a hooking unit 22, and a limiting unit 23. The positioning unit 21 is disposed on the carrier base 11 and has three positioning protrusions 24 protruding out of a top surface of the carrier base 11 at spaced intervals. With reference to FIGS. 6A, 7, and 12, the hooking unit 22 is disposed in the body 10 and has a driving assembly 25 and a hooking element 26. With reference to FIG. 12, the driving assembly 25 is disposed in the body 10. The hooking element 26 is mounted to the driving assembly 25. The driving assembly 25 drives the hooking element 26 to extend out of the slide groove 12 of the carrier base 11. The limiting unit 23 is disposed on the top surface of the carrier base 11 and has multiple limiting blocks 29. With reference to FIGS. 7 and 12, the multiple limiting blocks 29 are disposed on the top surface of the carrier base 11 at spaced intervals.

With reference to FIGS. 6A, 6B, and 7, the sensing mechanism 30 is disposed on the carrier base 11 of the body 10 and has a first sensor 31, a second sensor 32, a third sensor 33, a fourth sensor 34, a fifth sensor 35, a sixth sensor 36, a seventh sensor 37, and an eighth sensor 38. All the sensors 31, 32, 33, 34, 35, 36, 37, 38 are disposed in the carrier base 11 and protrude out of the top surface of the carrier base 11. The first sensor 31 and the second sensor 32 form a detecting set for an eight-inch bare wafer. The third sensor 33, the fourth sensor 34, the fifth sensor 35, and the sixth sensor 36 form a detecting set for a twelve-inch mounted wafer. The third sensor 33, the fourth sensor 34, the fifth sensor 35, the sixth sensor 36, the seventh sensor 37, and the eighth sensor 38 form a detecting set for a twelve-inch bare wafer.

With reference to FIGS. 2 to 5, the detecting mechanism 40 is disposed on the body 10, is on a back side of the carrier base 11 of the body 10, and detects the storage states of wafers stored in the wafer cassette. The detecting mechanism 40 has a first detecting assembly 41 and a second detecting assembly 42. The first detecting assembly 41 is disposed on the body 10 and has a first driving element 411, a first L-shaped lever arm 412, a first transmission element 413, and a first detecting unit 414. The first driving element 411 is disposed on the body 10. The first L-shaped lever arm 412 is pivotally connected to the body 10. The first transmission element 413 is disposed on the body 10 and is connected to the first driving element 411 and the first L-shaped lever arm 412. The first detecting unit 414 is disposed on a top of the first driving element 411 and has two first detecting portions 415 spaced apart from each other.

With reference to FIGS. 2 to 5, the second detecting assembly 42 is disposed on the body 10, is located opposite to the first detecting assembly 41, and has a second driving element 421, a second L-shaped lever arm 422, a second transmission element 423, and a second detecting unit 424. The second driving element 421 is disposed on the body 10. The second L-shaped lever arm 422 is pivotally connected to the body 10. The second transmission element 423 is disposed on the body 10 and is connected to the second driving element 421 and the second L-shaped lever arm 422. The second detecting unit 424 is disposed on a top of the second driving element 421 and has two second detecting portions 425 spaced apart from each other. A distance between the two first detecting portions 415 is smaller than that between the two second detecting portions 425. The first detecting assembly 41 and the second detecting assembly 42 of the detecting mechanism 40 detect the storage states of the wafers stored in the wafer cassette. The storage states for detection include empty slots, double slotted wafers, cross slotted wafers, deformation of wafers, and position of wafers.

With reference to FIG. 5, in the present invention, the first transmission element 413 and the second transmission element 423 are both belt drives, and each one of the transmission elements 413, 423 includes two grooved pulleys and a belt mounted around the two grooved pulleys. The first driving element 411 has a pneumatic cylinder 43 and a clamping arm 44. The pneumatic cylinder 43 of the first driving element 411 is disposed on the body 10. The clamping arm 44 of the first driving element 411 is mounted to the pneumatic cylinder 43 of the first driving element 411 and clamps the belt of the first transmission element 413 as a belt drive, and a displacement of the clamping arm 44 of the first driving element 411 is controlled by the pneumatic cylinder 43 of the first driving element 411. The second driving element 421 has a pneumatic cylinder 43 and a clamping arm 44. The pneumatic cylinder 43 of the second driving element 421 is disposed on the body 10. The clamping arm 44 of the second driving element 421 is mounted to the pneumatic cylinder 43 and clamps the belt of the second transmission element 423 of the second driving element 421 as a belt drive, and a displacement of the clamping arm 44 of the second driving element 421 is controlled by the pneumatic cylinder 43 of the second driving element 421.

Figure 8:
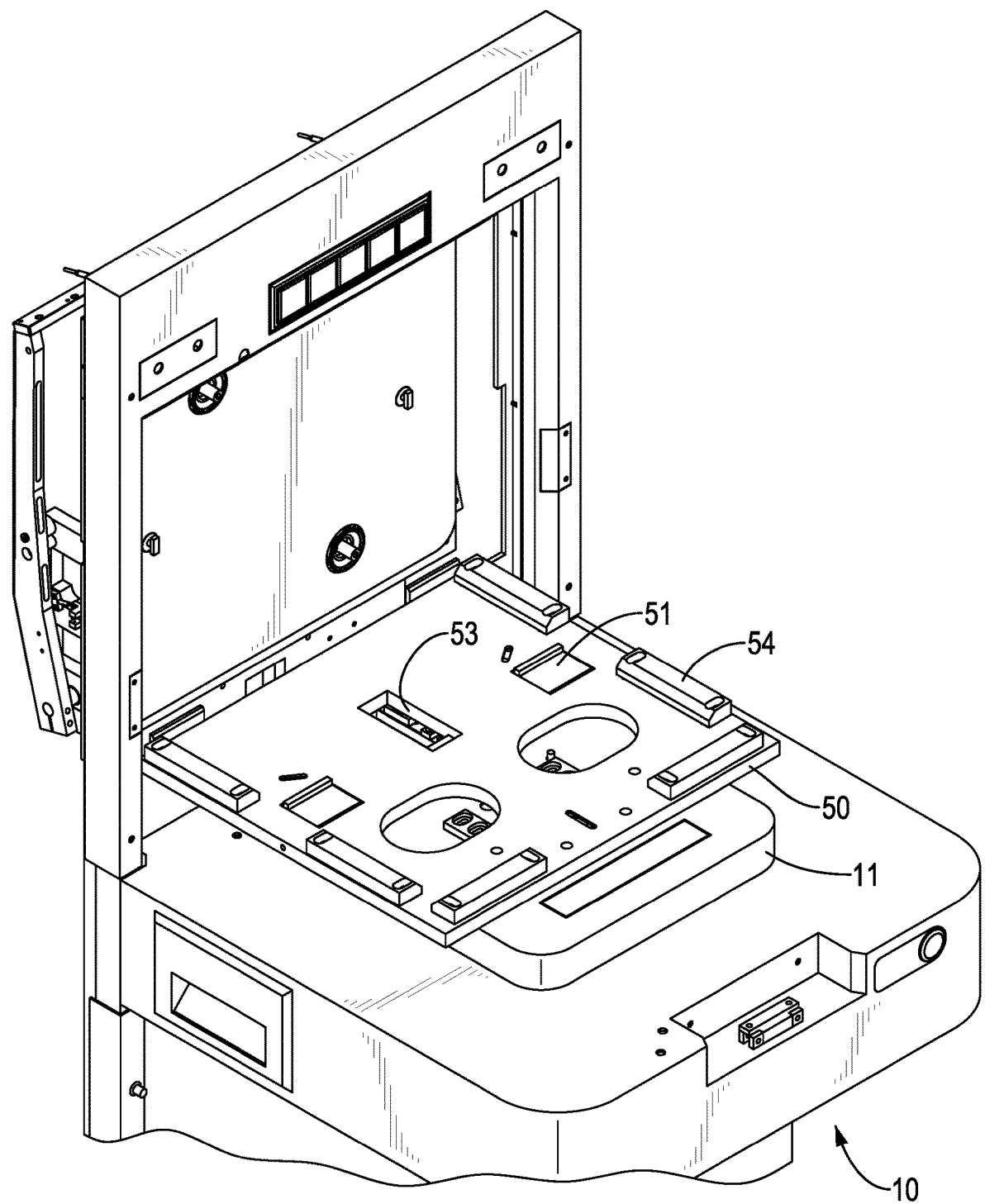
FIG. 8 is an enlarged perspective view of the load port in FIG. 6A, shown with an adapter plate mounted on the carrier base of the load port.
Figure 9:
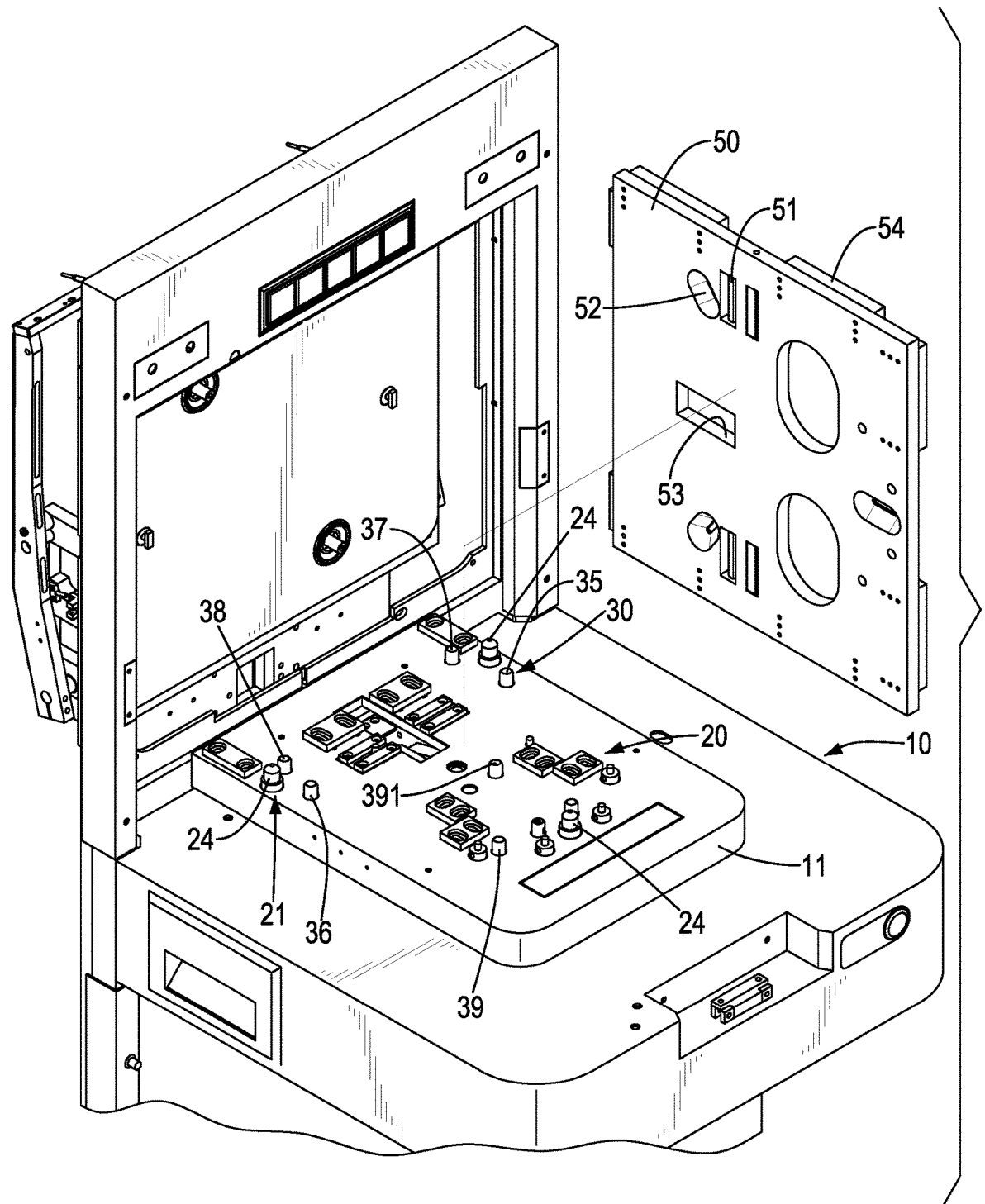
FIG. 9 is an enlarged exploded perspective view of the adapter plate and the carrier base in FIG. 8.
Figure 10:
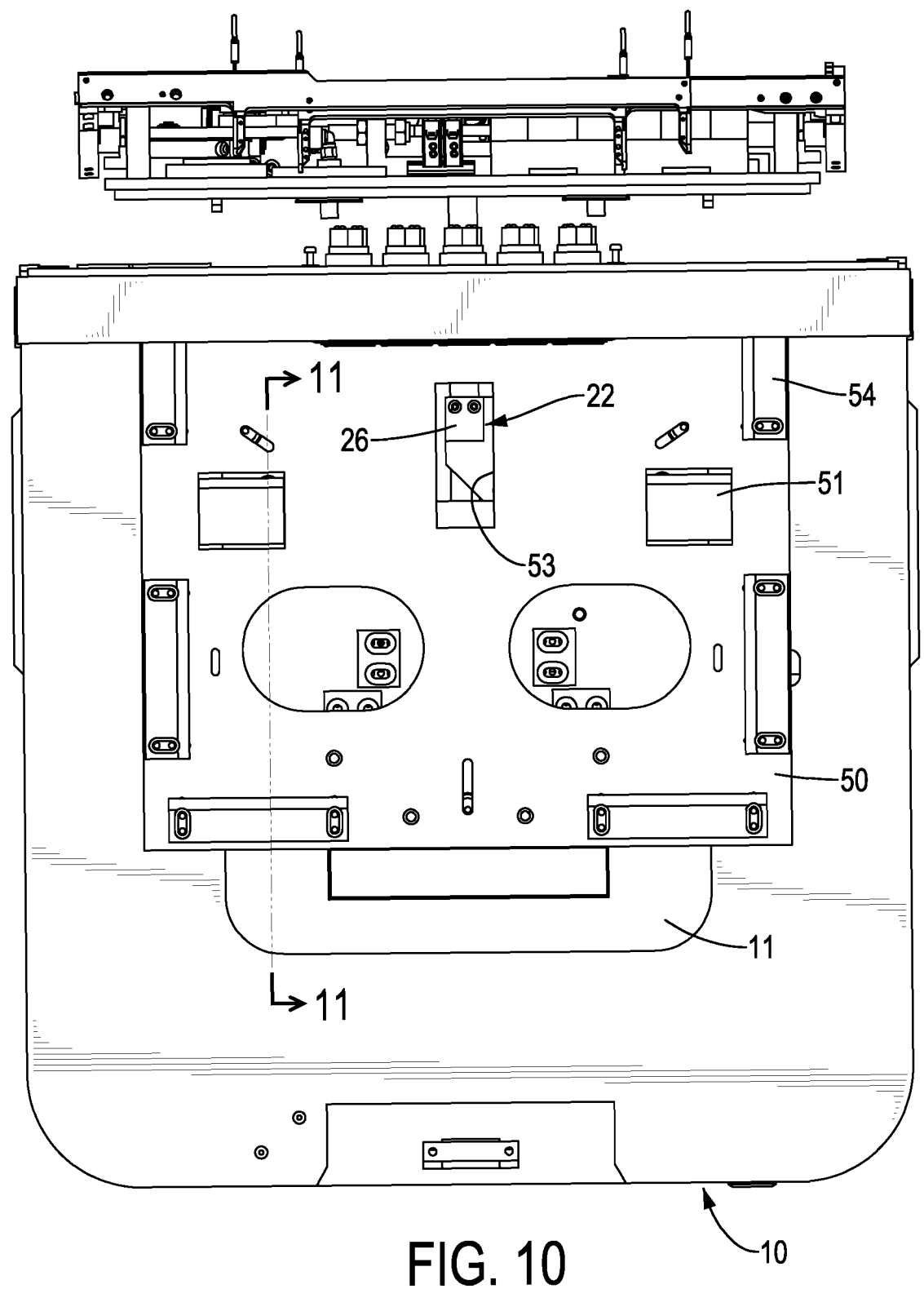
FIG. 10 is a top side view of the load port in FIG. 8.
Figure 11:
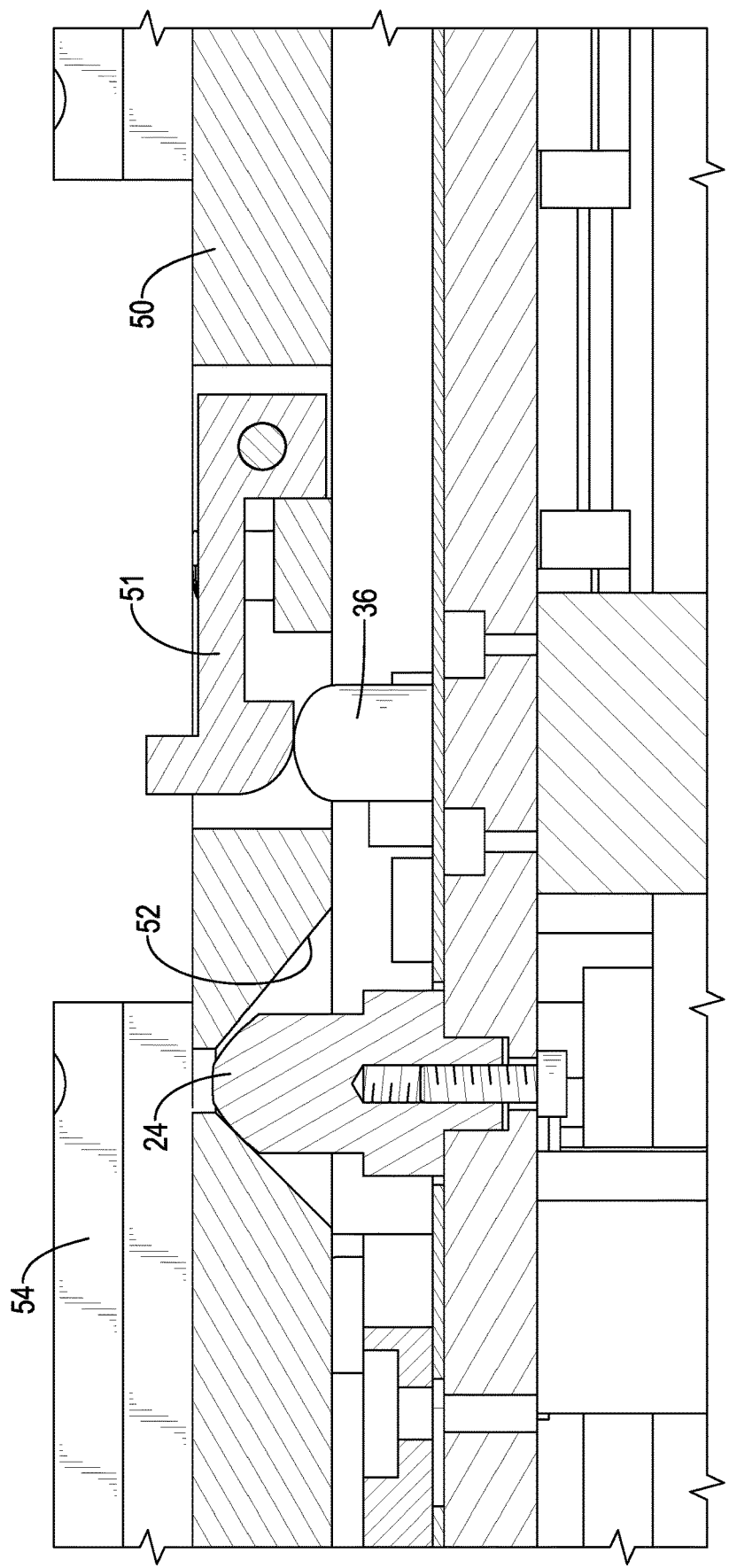
FIG. 11 is an enlarged cross-sectional side view of the load port along a line 11-11 in FIG. 10.

With reference to FIGS. 8 to 10, in the present invention, the load port in accordance with the present invention further includes an adapter plate 50 mounted on the carrier base 11 of the body 10. The adapter plate 50 has three first fixing grooves 52, a second fixing groove 53, and two pressure plates 51. The three first fixing grooves 52 are formed through the adapter plate 50, and an inner perimeter of an inner surface of each one of the three first fixing grooves 52 gradually decreases from a bottom of the corresponding first fixing groove 52 to a top of the corresponding first fixing groove 52. Each one of the three positioning protrusions 24 of the positioning unit 21 extends into a respective one of the three first fixing grooves 52 of the adapter plate 50. The second fixing groove 53 is formed through the adapter plate 50. The hooking element 26 of the hooking unit 22 extends into the second fixing groove 53 of the adapter plate 50 to hook the adapter plate 50 and position the adapter plate 50.

The two pressure plates 51 are pivotally mounted to the adapter plate 50 at a spaced interval and respectively abut against the fifth sensor 35 and the sixth sensor 36 of the sensing mechanism 30. The fifth sensor 35 and the sixth sensor 36 form a detecting set for an eight-inch mounted wafer. The sensing mechanism 30 further has a ninth sensor 39 and a tenth sensor 391 both disposed in the carrier base 11 and protruding out of the top surface of the carrier base 11. The seventh sensor 37, the eighth sensor 38, the ninth sensor 39 and the tenth sensor 391 form a detecting set for the adapter plate 50. Moreover, the adapter plate 50 has multiple positioning blocks 54 disposed on a top surface of the adapter plate 50, disposed adjacent to an edge of the adapter plate 50, and arranged at spaced intervals.

With reference to FIG. 12, the driving assembly 25 has a lateral driver 27 and a vertical driver 28. The lateral driver 27 is disposed in the body 10. The vertical driver 28 is mounted to the lateral driver 27, and a lateral displacement of the vertical driver 28 is controlled by the lateral driver 27. The hooking element 26 is mounted to the vertical driver 28 of the driving assembly 25, and a vertical displacement of the hooking element 26 is controlled by the vertical driver 28. In the present invention, the vertical driver 28 is a pneumatic cylinder.

Figure 1:
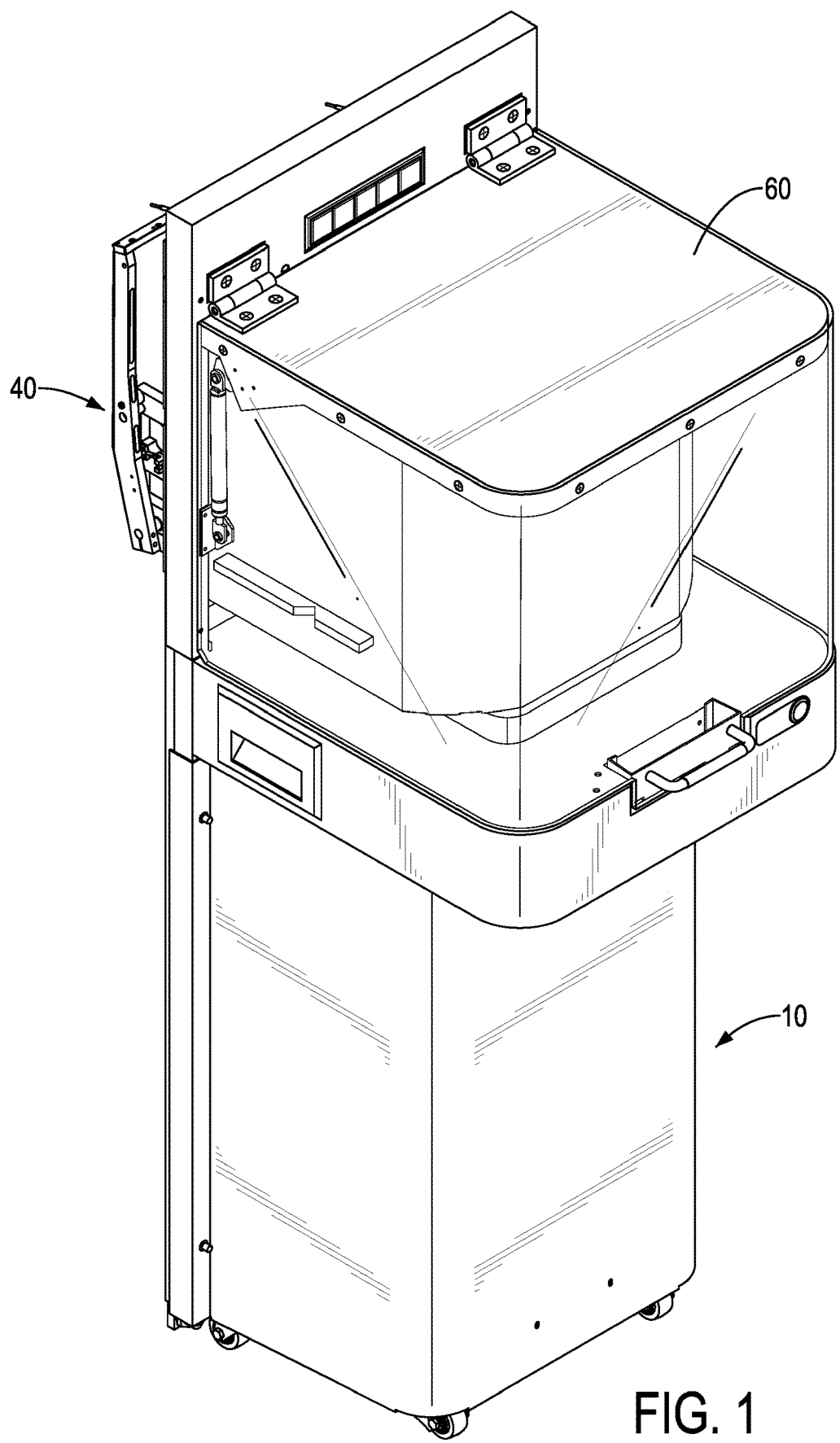
FIG. 1 is a perspective view of a load port in accordance with the present invention, shown with a first-type wafer cassette loaded onto the load port.
Figure 4:
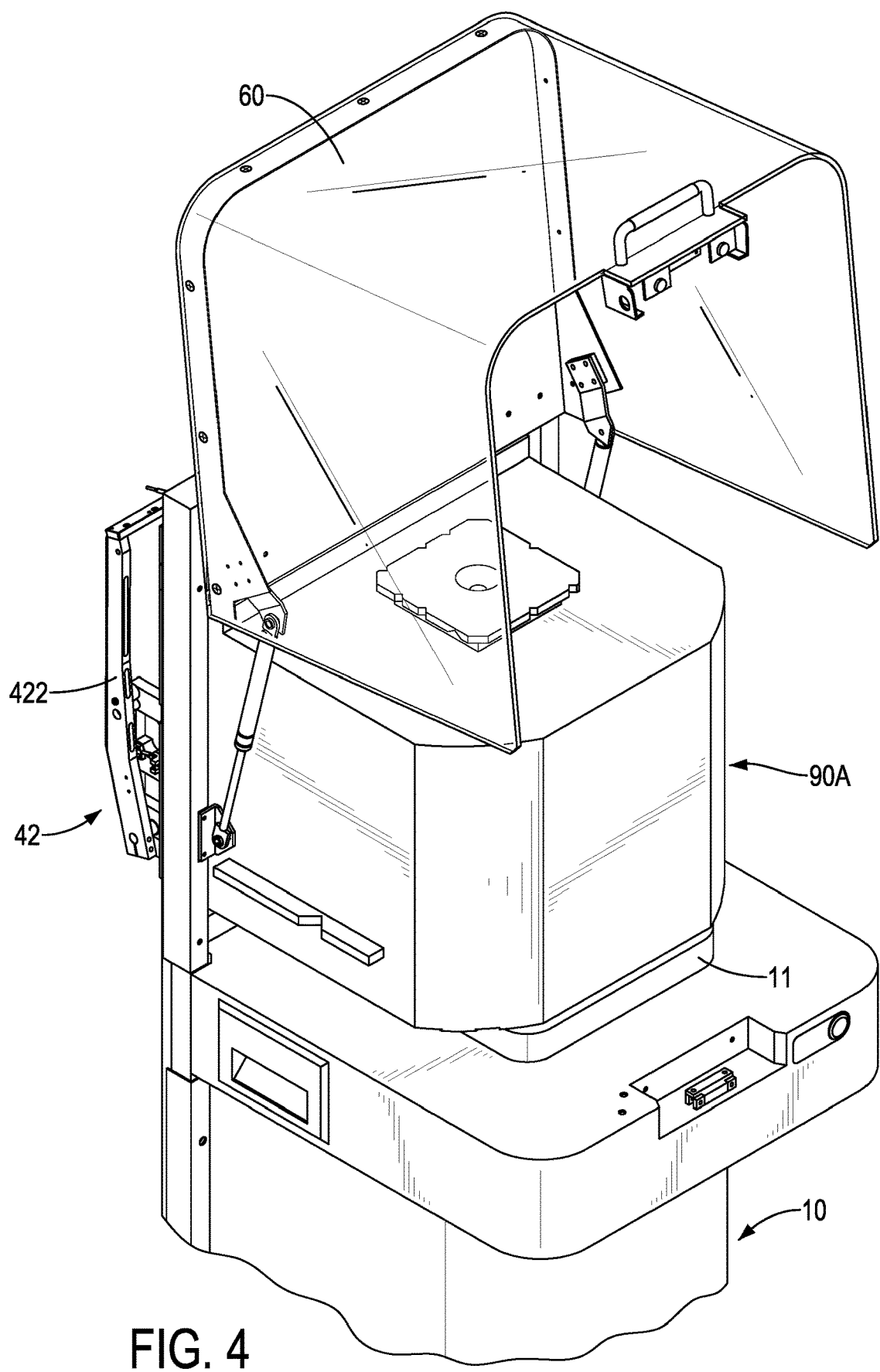
FIG. 4 is an enlarged perspective view of the load port in FIG. 1, shown with a lid lifted from the load port.

With reference to FIGS. 1 and 4, the load port in accordance with the present invention further includes a lid 60. The lid 60 is detachably mounted to the body 10 and covers the carrier base 11 of the body 10.

Figure 2:
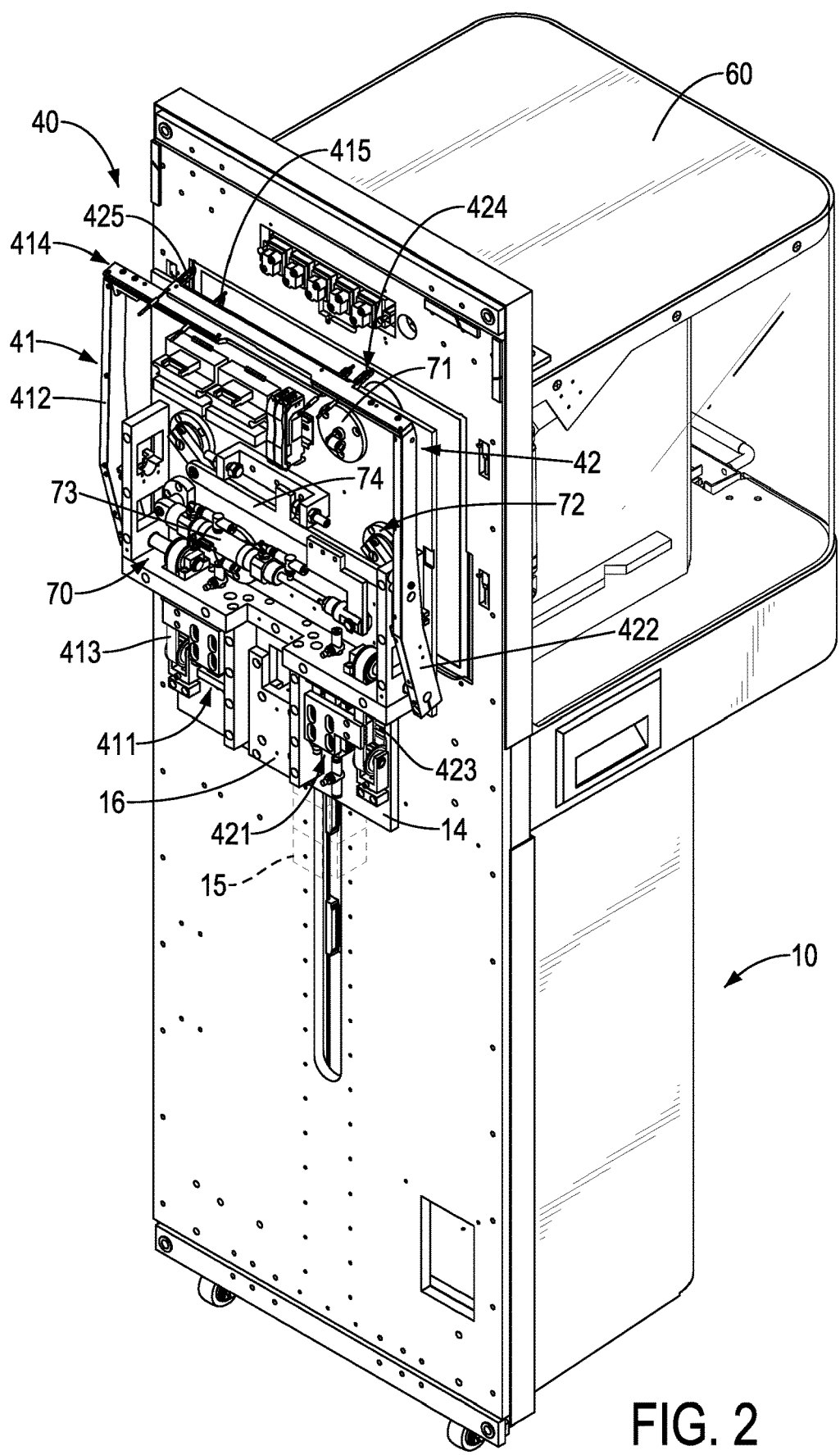
FIG. 2 is another perspective view of the load port in FIG. 1.
Figure 3:
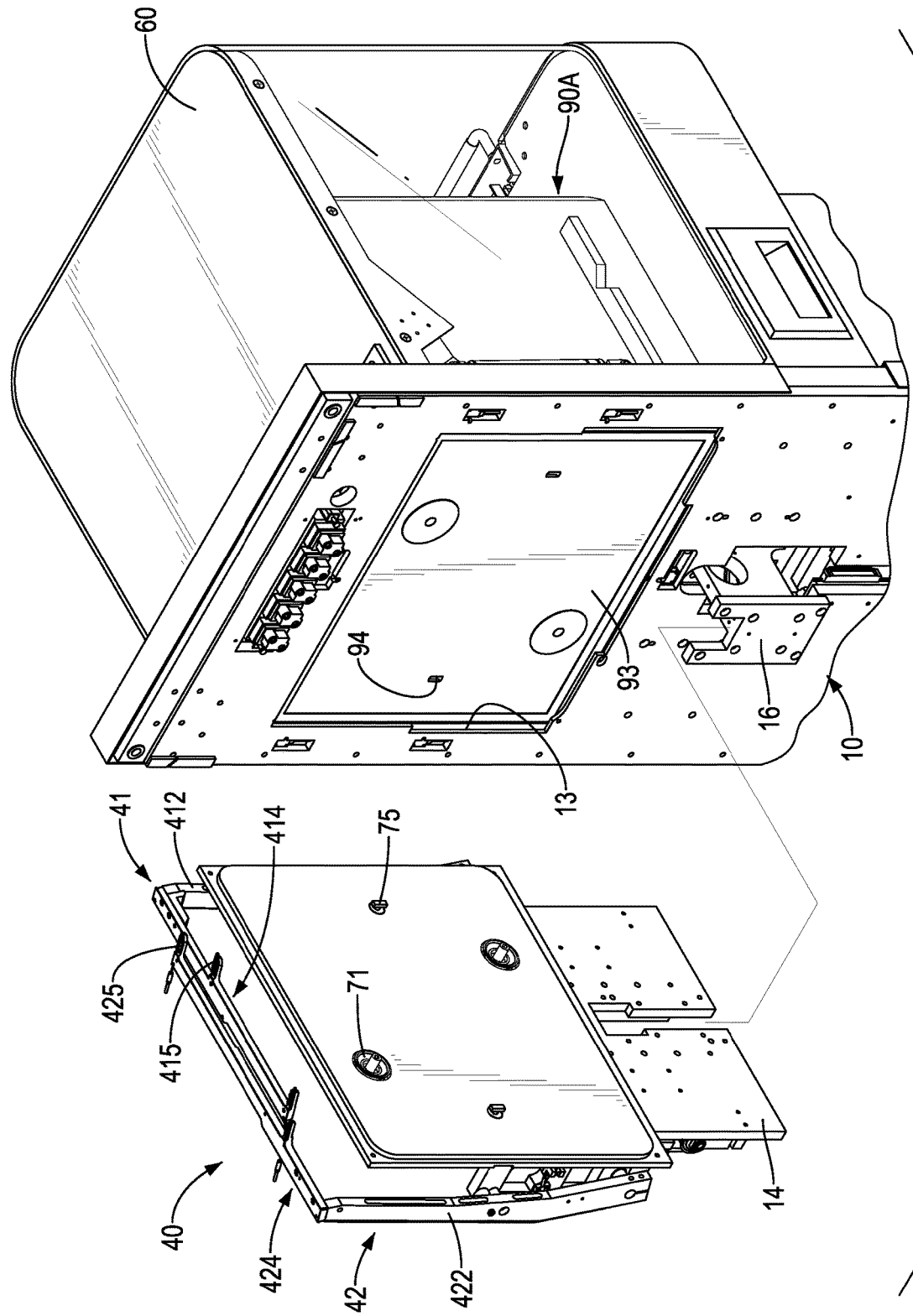
FIG. 3 is an enlarged exploded perspective view of the load port in FIG. 2.

With reference to FIGS. 2, 3, and 5, the body 10 has an opening 13, an actuator 15, a linkage arm 16, and a mounting base 14. The opening 13 is formed on the back side of the body 10, and the opening 13 is located above the carrier base 11 of the body 10. The actuator 15 is disposed in the body 10. The linkage arm 16 is connected to the actuator 15. The mounting base 14 is mounted to the linkage arm 16 and is located on a side of the opening 13. The actuator 15 can move the mounting base 14 via the linkage arm 16 to cover the opening 13 or leave the opening 13 uncovered. In addition, the detecting mechanism 40 is disposed on the mounting base 14, and the first L-shaped lever arm 412 and the second L-shaped lever arm 422 are respectively located on two sides of the mounting base 14. The position of the first L-shaped lever arm 412 relative to the opening 13 of the body 10 is controlled by the pneumatic cylinder 43 of the first driving element 411, and the position of the second L-shaped lever arm 422 relative to the opening 13 of the body 10 is controlled by the pneumatic cylinder 43 of the second driving element 421. To scan the wafers stored in the wafer cassette, the first L-shaped lever arm 412 and the second L-shaped lever arm 422 move forward and toward the opening 13 of the body 10. When no scanning is to be performed, the first L-shaped lever arm 412 and the second L-shaped lever arm 422 will move backward away from the opening 13 of the body 10.

With reference to FIGS. 2, 3, and 5, moreover, the load port in accordance with the present invention further includes a door opening mechanism 70. The door opening mechanism 70 is mounted to the mounting base 14 and has two suction nozzle units 71 and a knob unit 72. The two suction nozzle units 71 are mounted on the mounting base 14 and are disposed at a spaced interval. The knob unit 72 is mounted on the mounting base 14 and has an actuating element 73, a connecting lever arm 74, and two knobs 75. The actuating element 73 is mounted on the mounting base 14. The connecting lever arm 74 is connected to the actuating element 73. The two knobs 75 are mounted on the mounting base 14, and each one of the two knobs 75 is connected to the connecting lever arm 74. In the present invention, the actuating element 73 is a pneumatic cylinder.

Figure 13:
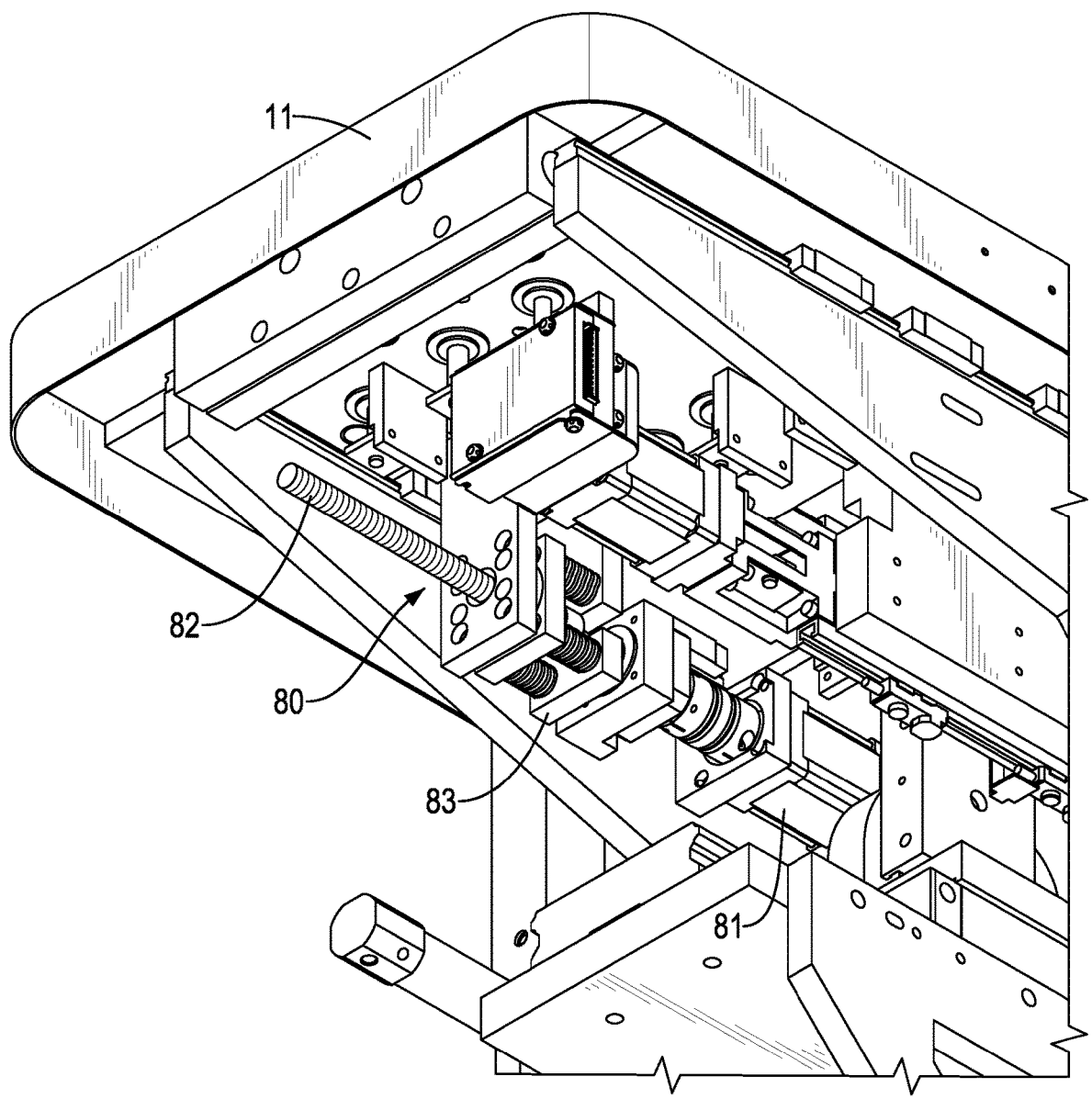
FIG. 13 is an enlarged perspective view of a displacement adjusting assembly of the load port in FIG. 1.
Figure 14:
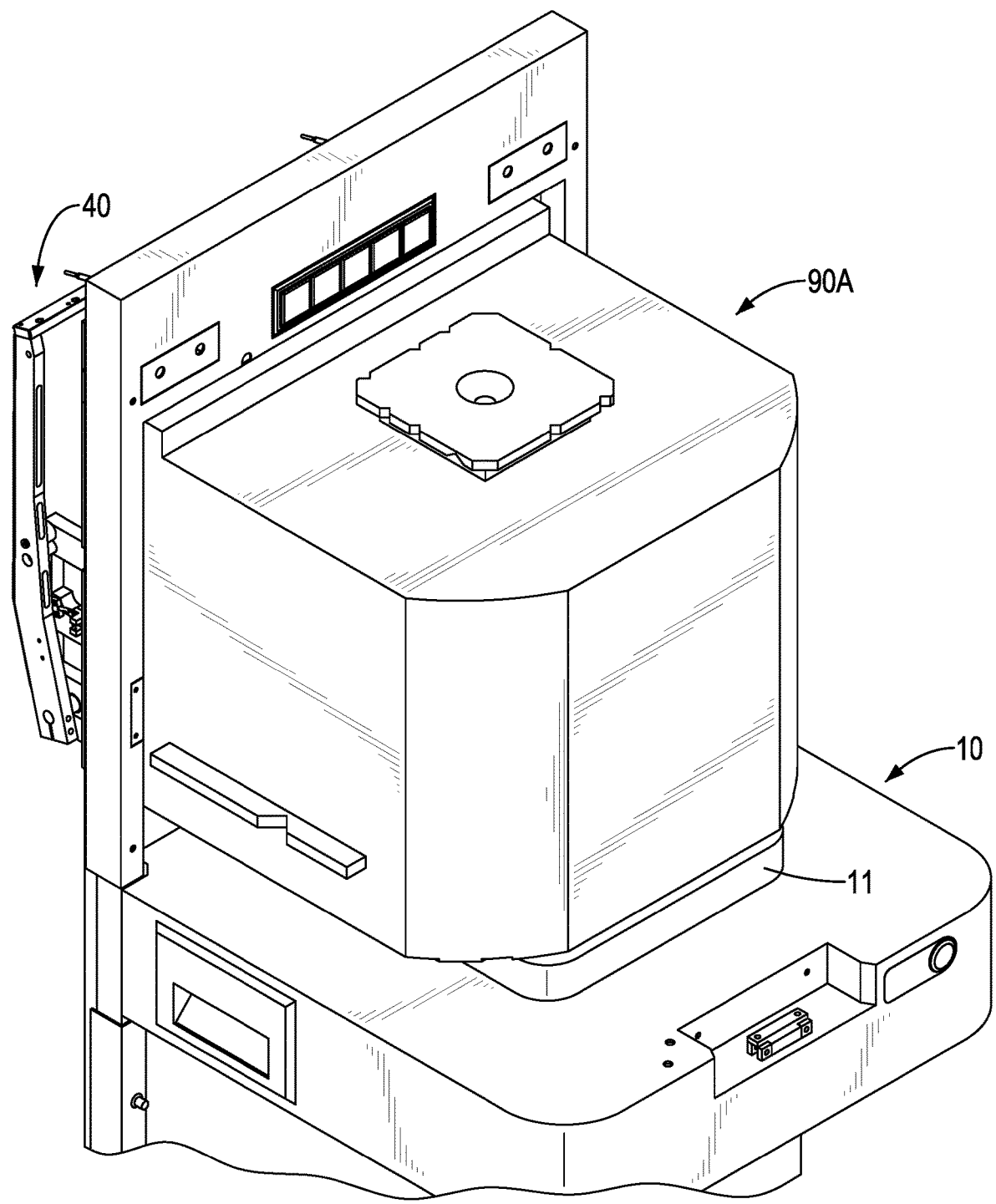
FIG. 14 is an enlarged perspective view of the load port in FIG. 6A, shown with the first-type wafer cassette loaded onto the load port and the lid detached from the load port.
Figure 15:
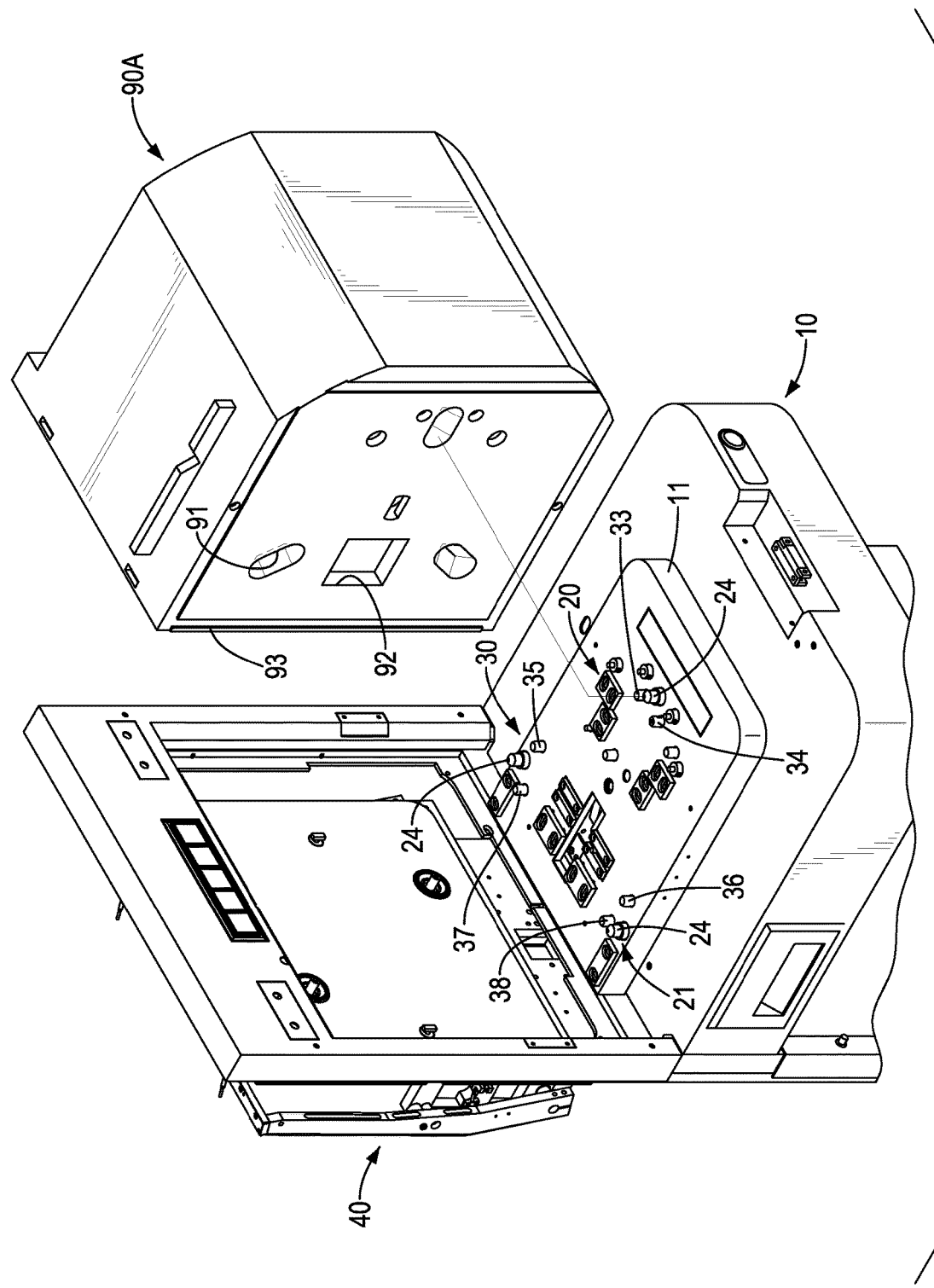
FIG. 15 is an enlarged exploded perspective view of the first-type wafer cassette and the load port in FIG. 14.

With reference to FIG. 13, the load port in accordance with the present invention further includes a displacement adjustment assembly 80 disposed on the body 10. The displacement adjustment assembly 80 is mounted to the carrier base 11 of the body 10, is located below the carrier base 11, moves the carrier base 11, and has a motor 81, a lead screw 82, and a slide block 83. The motor 81 is mounted on the body 10. The lead screw 82 is mounted to the motor 81, and a displacement of the lead screw 82 is controlled by the motor 81. The slide block 83 is fixed on a bottom surface of the carrier base 11 and is mounted to the lead screw 82. The lead screw 82 is disposed through the slide block 83. The motor 81 drives the lead screw 82 to rotate, and the slide block 83 moves along with an axis of the lead screw 82. Then the carrier base 11 moves along with the slide block 83. In such an arrangement, the position of the carrier base 11 relative to the body 10 can be adjusted according to a size of the wafer cassette.

With reference to FIGS. 1 to 3, 14, and 15, a first-type wafer cassette 90A is loaded onto the load port in accordance with the present invention. The first-type wafer cassette 90A has three positioning grooves 91, a hooked groove 92, and a door 93. The three positioning grooves 91 and the hooked groove 92 are formed on a bottom surface of the first-type wafer cassette 90A. The door 93 is disposed on a back side of the first-type wafer cassette 90A, is adjacent to the opening 13 of the body 10, and has two knob receiving holes 94. The two knob receiving holes 94 are formed through the door 93 and are disposed at a spaced interval. When the first-type wafer cassette 90A is loaded onto the carrier base 11 of the body 10, each one of the three positioning protrusions 24 of the positioning unit 21 extends into a respective one of the three positioning grooves 91 to position the first-type wafer cassette 90A onto the carrier base 11 preliminarily. Next, with reference to FIG. 12, the lateral driver 27 of the driving assembly 25 drives the vertical driver 28 to move laterally, and the vertical driver 28 drives the hooking element 26 to move vertically, such that the hooking element 26 extends out of the slide groove 12 of the carrier base 11 and extends into the hooked groove 92 of the first-type wafer cassette 90A to hook the first-type wafer cassette 90A to the carrier base 11. In such an arrangement, the first-type wafer cassette 90A can be positioned on the carrier base 11 firmly.

After the first-type wafer cassette 90A is well positioned on the carrier base 11, the door 93 is detached from the first-type wafer cassette 90A by the door opening device 70 to enable the detecting mechanism 40 to detect the storage states of the wafers stored in the first-type wafer cassette 90A. To open the door 93 of the first-type wafer cassette 90A, the actuator 15 of the body 10 moves the mounting base 14 to make the two suction nozzle units 71 move toward the door 93 and adsorb the door 93. In the meanwhile, the two knobs 75 of the two knob units 72 respectively extend into the two knob receiving holes 94 of the door 93. The actuating element 73 makes the two knobs 75 rotate via the connecting lever bar 73, which makes the two knobs 75 abut against an inner surface of the door 93. In the end, the actuator 15 of the body 10 moves the mounting base 14 again to make the two suction nozzle units 71 move away from the body 10, and then the two suction nozzle units 71 and the two knobs 75 detach the door 93 from the first-type wafer cassette 90A.

With reference to FIGS. 3 and 5, after the door 93 is detached, either the first detecting assembly 41 or the second detecting assembly 42 of the detecting mechanism 40 can be selected to detect the storage states of the wafers stored in the first-type wafer cassette 90A via the opening 13. If each one of the wafers accommodated in the first-type wafer cassette 90A is an eight-inch wafer, the first detecting assembly 41 should be selected. If each one of the wafers accommodated in the first-type wafer cassette 90A is a twelve-inch wafer, the second detecting assembly 42 should be selected.

Take selecting the first detecting assembly 41 as an example. The pneumatic cylinder 43 of the first driving element 411 drives the clamping arm 44 to move upwardly and downwardly. Linking the first driving element 411 and the first L-shaped lever arm 412, the first transmission element 413 moves upwardly and downwardly along with the clamping arm 44 of the first driving element 411 and makes the first L-shaped lever arm 412 pivot relative to the body 10 and move toward the opening 13 of the body 10. Then the two first detecting portions 415 of the first detecting unit 414 disposed on the first L-shaped lever arm 412 can detect the storage states of the wafers stored in the first-type wafer cassette 90A via the opening 13.

If the second detecting assembly 42 is selected, the second L-shaped lever arm 422 moves in the same way as the first L-shaped lever arm 412 does, and the two second detecting portions 425 of the second detecting unit 424 detect the storage state of the wafers stored in the first-type wafer cassette 90A in the same way as the two first detecting portions 415 do. When the first-type wafer cassette 90A is loaded onto the carrier base 11, the first-type wafer cassette 90A presses on the third sensor 33, the fourth sensor 34, the fifth sensor 35, the sixth sensor 36, the seventh sensor 37, and the eighth sensor 38 of the sensing mechanism 30. With the above-mentioned sensors 33, 34, 35, 36, 37, the load port of the present invention can tell whether the first-type wafer cassette 90A is loaded onto the carrier base 11 or not.

Figure 16:
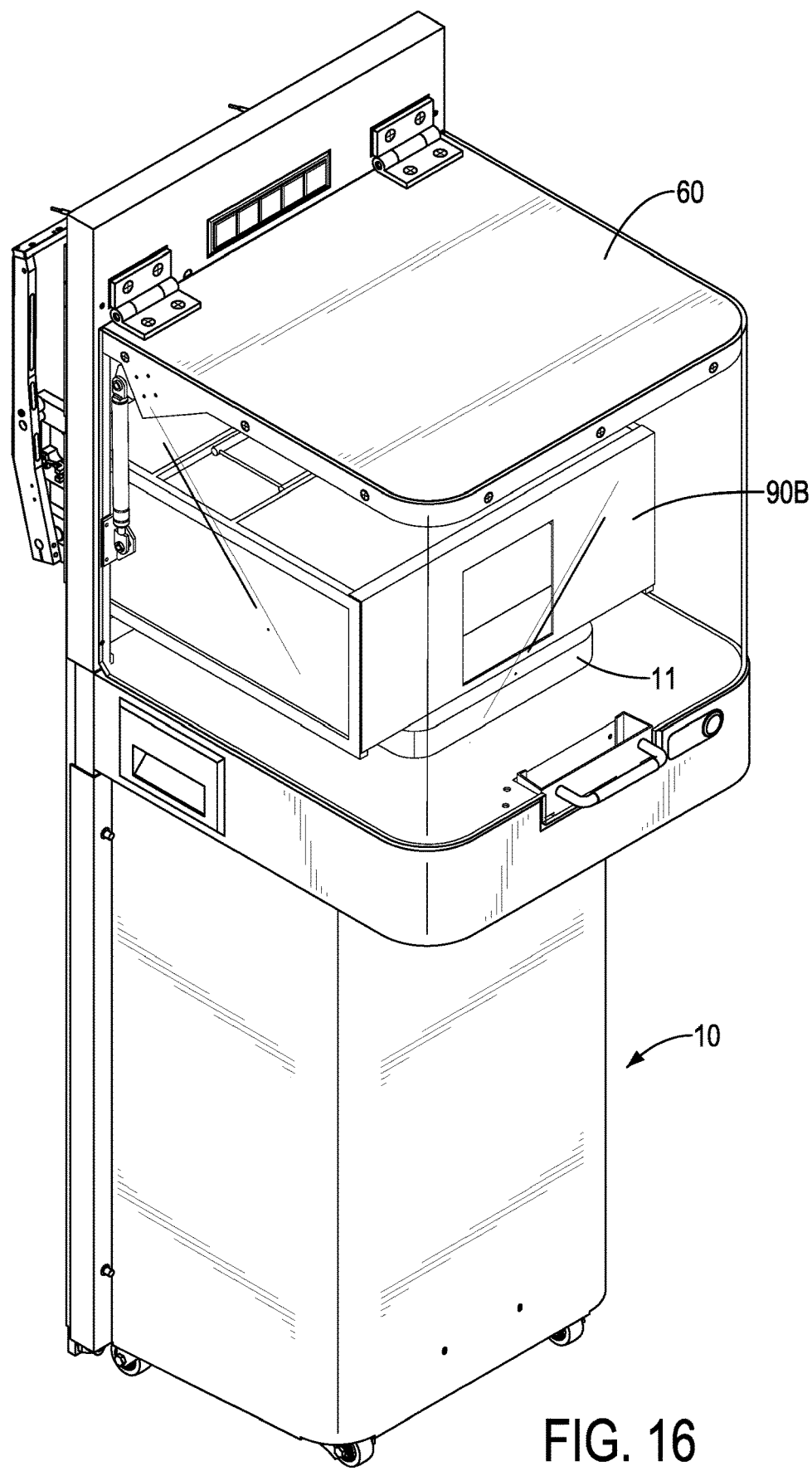
FIG. 16 is a perspective view of the load port in FIG. 1, shown with a second-type wafer cassette loaded onto the load port.
Figure 17:
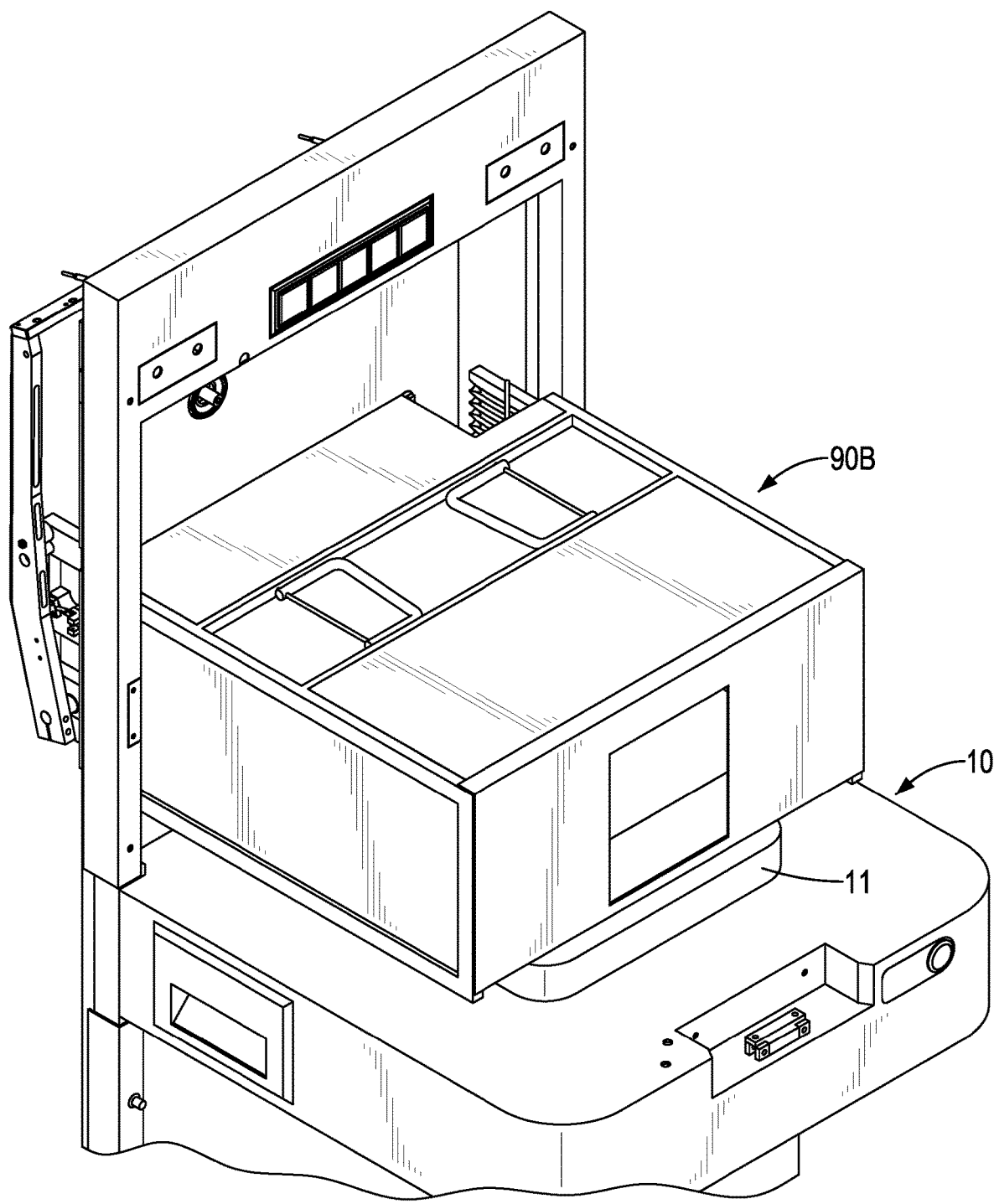
FIG. 17 is an enlarged perspective view of the load port in FIG. 16, shown with the second-type wafer cassette loaded onto the load port and the lid detached from the load port.
Figure 18:
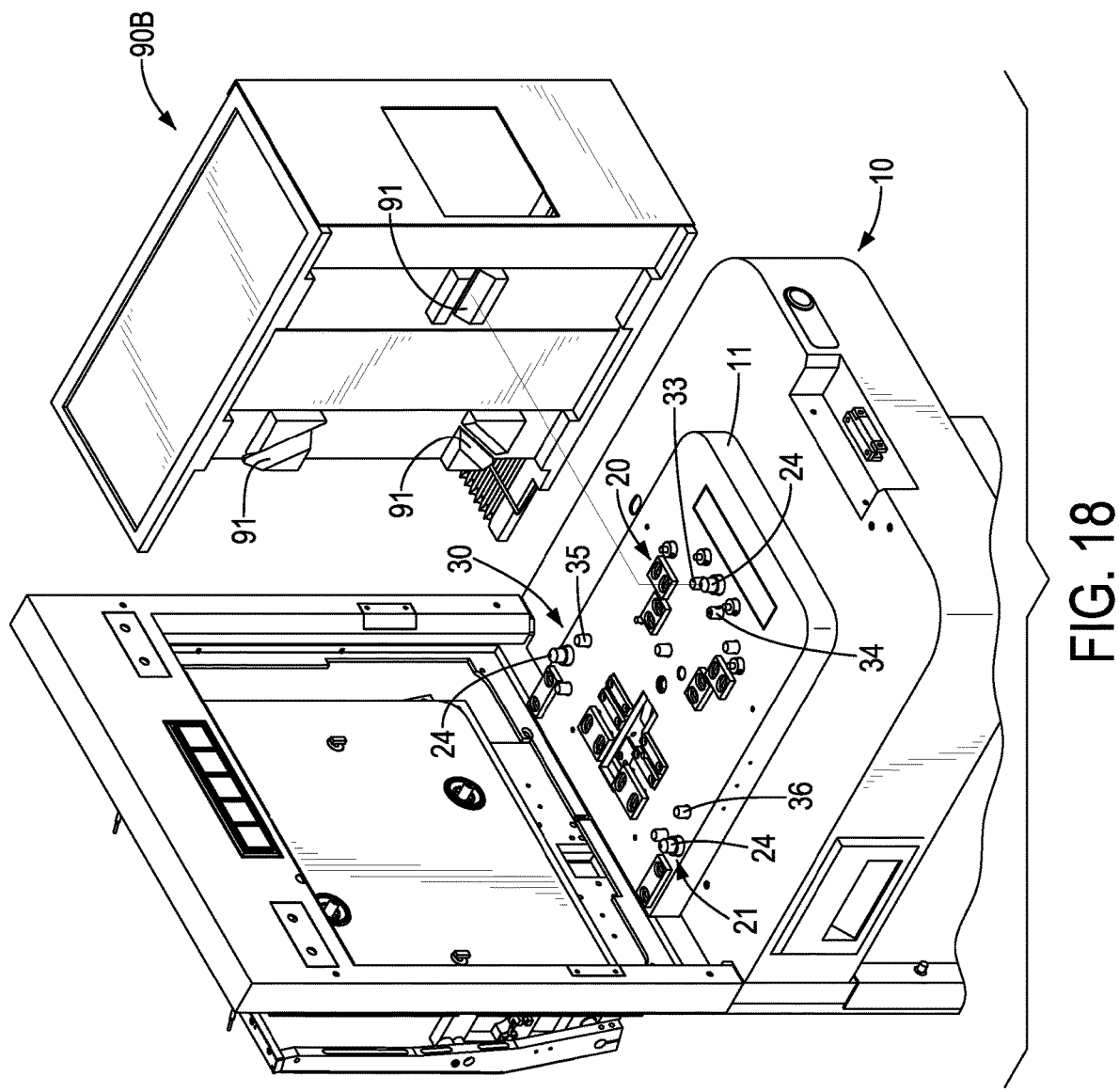
FIG. 18 is an enlarged exploded perspective view of the second-type wafer cassette and the load port in FIG. 17.
Figure 19:
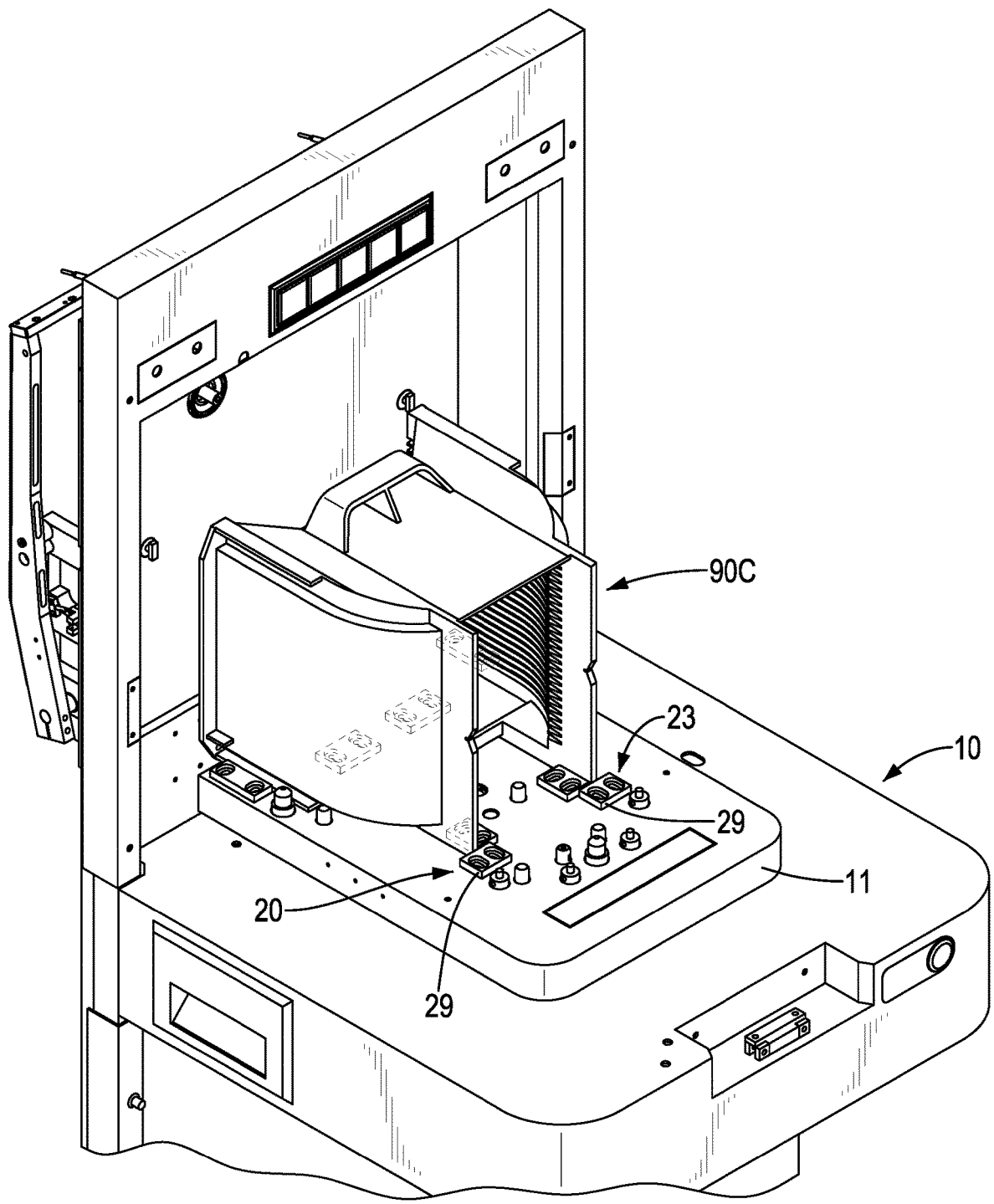
FIG. 19 is an enlarged perspective view of the load port in FIG. 1, shown with a third-type wafer cassette loaded onto the load port and the lid detached from the load port.
Figure 20:
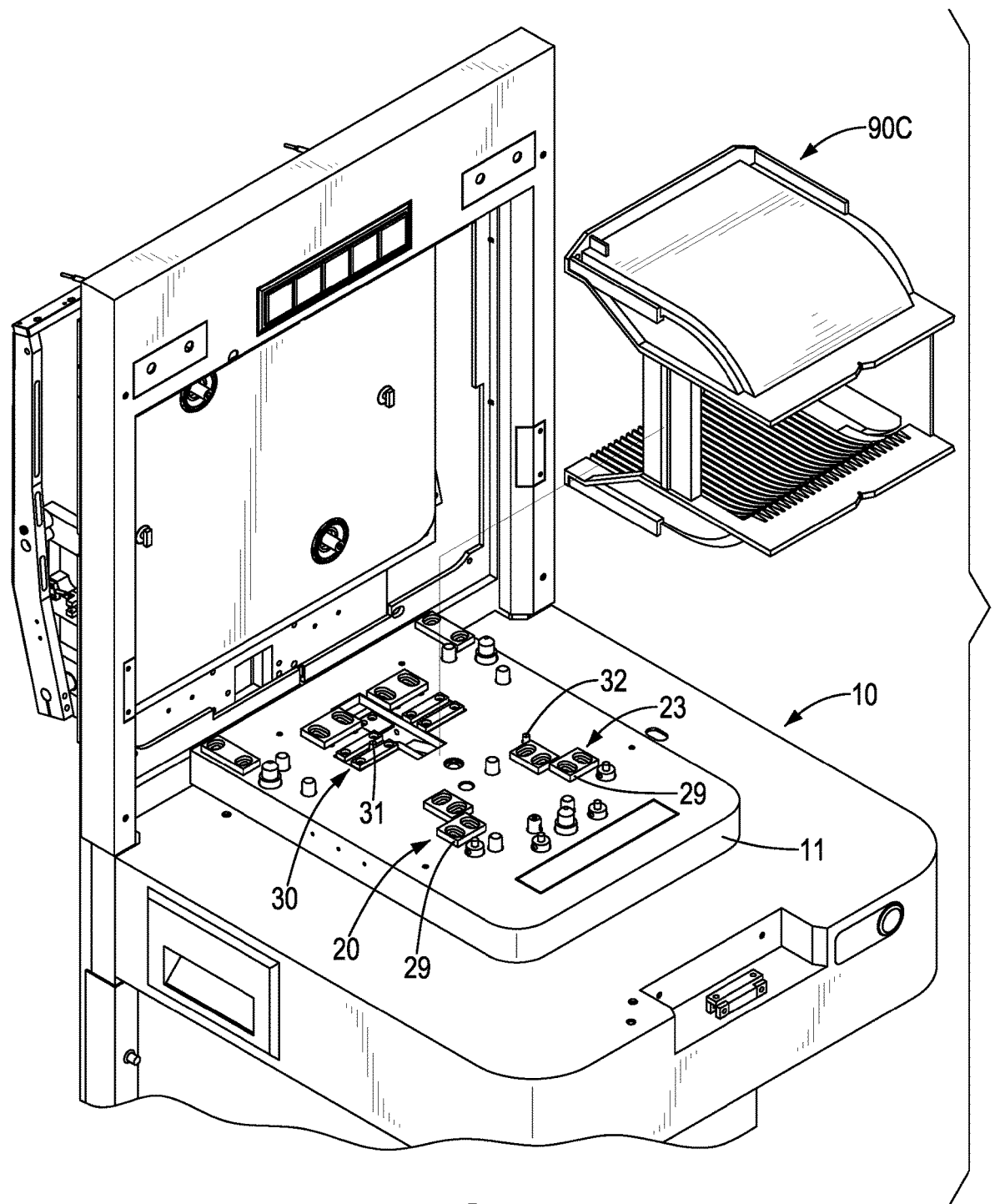
FIG. 20 is an enlarged exploded perspective view of the third-type wafer cassette and the load port in FIG. 19.
Figure 21:
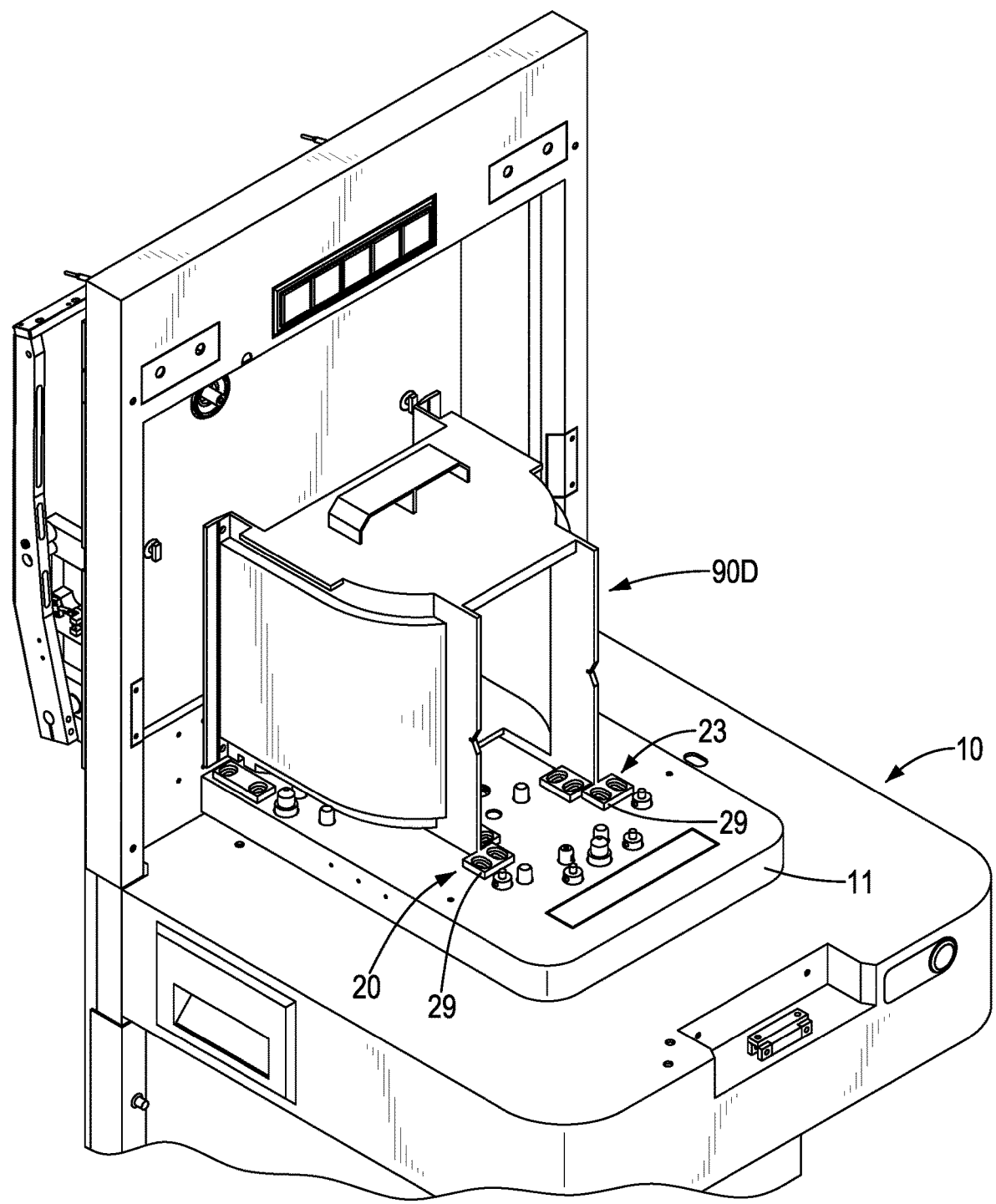
FIG. 21 is an enlarged perspective view of the load port in FIG. 1, shown with a fourth-type wafer cassette loaded onto the load port and the lid detached from the load port.
Figure 22:
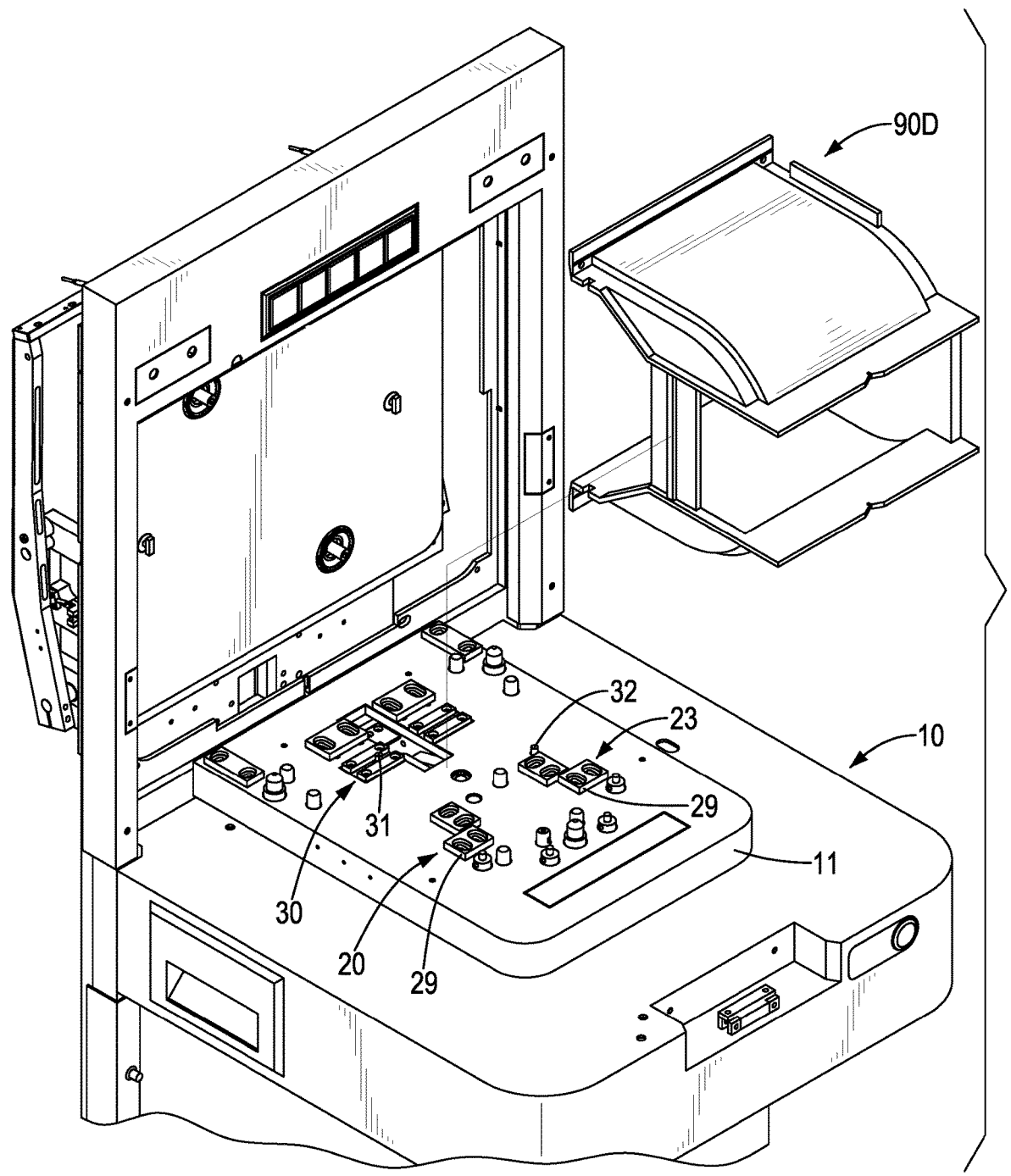
FIG. 22 is an enlarged exploded perspective view of the fourth-type wafer cassette and the load port in FIG. 21.
Figure 23:
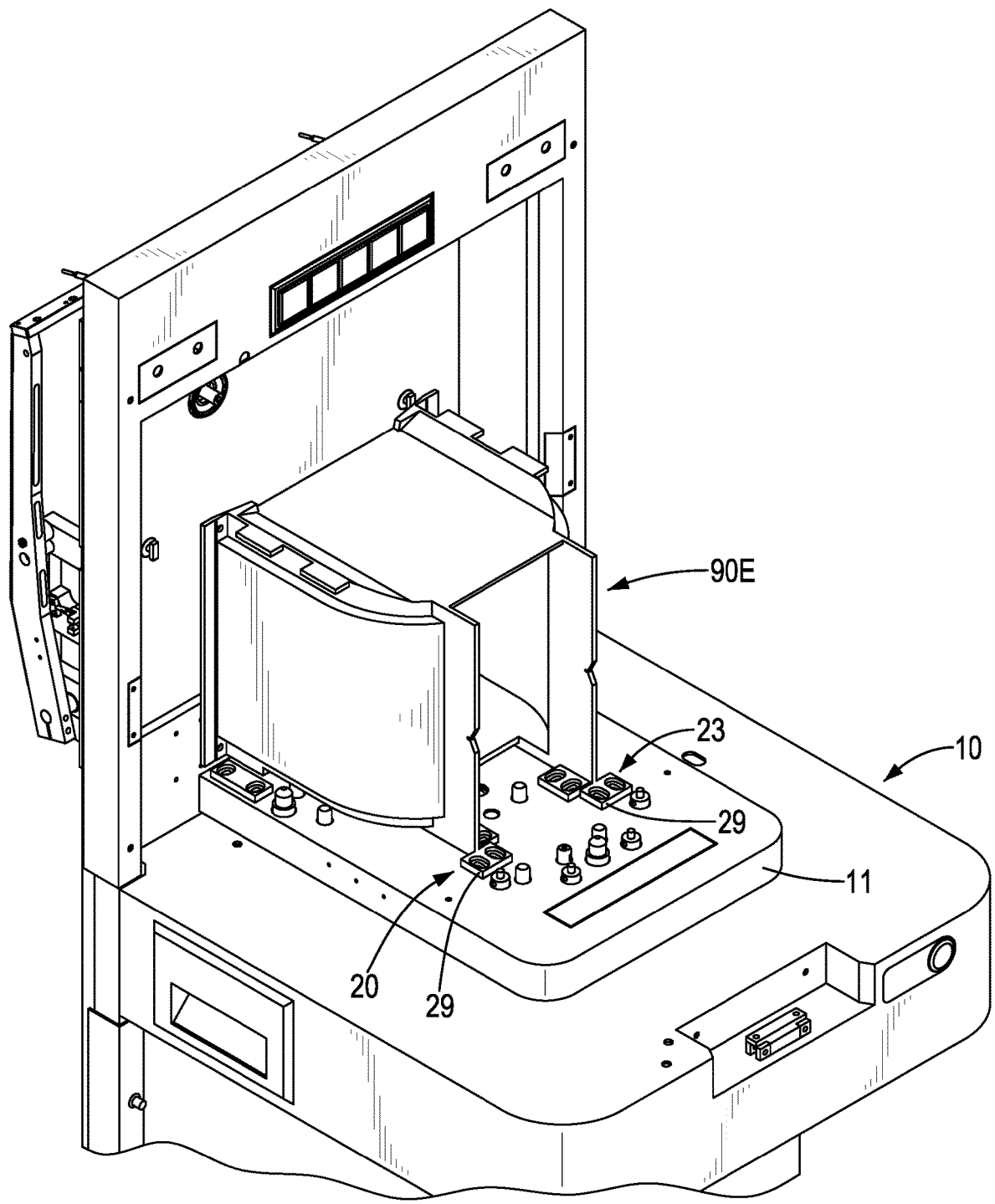
FIG. 23 is an enlarged perspective view of the load port in FIG. 1, shown with a fifth-type wafer cassette loaded onto the load port and the lid detached from the load port.
Figure 24:
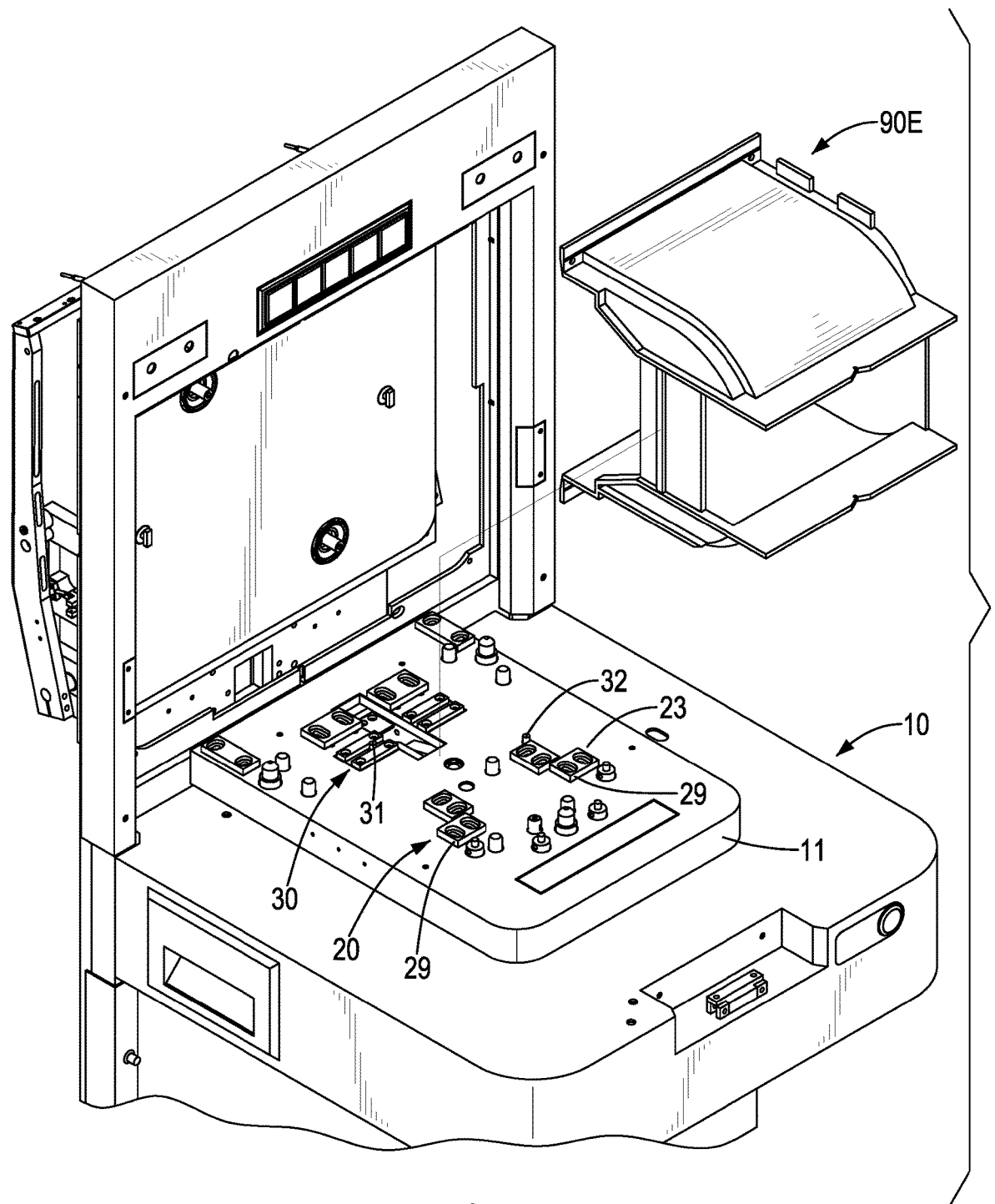
FIG. 24 is an enlarged exploded perspective view of the fifth-type wafer cassette and the load port in FIG. 23.

With reference to FIGS. 16 to 18, a second-type wafer cassette 90B is loaded onto the load port in accordance with the present invention. The second-type wafer cassette 90B has three positioning grooves 91. The three positioning grooves 91 are formed on a bottom surface of the second-type wafer cassette 90B. When the second-type wafer cassette 90B is loaded onto the carrier base 11 of the body 10, each one of the three positioning protrusions 24 of the positioning unit 21 extends into a respective one of the three positioning grooves 91 to position the second-type wafer cassette 90B onto the carrier base 11. After the second-type wafer cassette 90B is loaded onto the load port, mount the lid 60 onto the carrier base 11 of the body 10 to prevent the second-type wafer cassette 90B from collision. With the protection of the lid 60, the second-type wafer cassette 90B can be well protected. When the second-type wafer cassette 90B is loaded onto the carrier base 11, the second-type wafer cassette 90B presses on the third sensor 33, the fourth sensor 34, the fifth sensor 35, and the sixth sensor 36 of the sensing mechanism 30. Therefore, the load port of the present invention can tell whether the second-type wafer cassette 90B is loaded onto the carrier base 11 or not.

With reference to FIGS. 19 to 24, the load port in accordance with the present invention is adapted for a third-type wafer cassette 90C, a fourth-type wafer cassette 90D, and a fifth-type wafer cassette 90E. The multiple limiting blocks 29 of the limiting unit 23 of the positioning mechanism 20 position the third-type wafer cassette 90C, the fourth-type wafer cassette 90D, and the fifth-type wafer cassette 90E. Take the third-type wafer cassette 90C shown in FIGS. 19 and 20 as an example. When the third-type wafer cassette 90C is loaded onto the carrier base 11 of the body 10, two outer side surfaces of the third-type wafer cassette 90C respectively abut against two of the multiple limiting blocks 29, two bottom boards of the third-type wafer cassette 90C respectively abut against another two of the multiple limiting blocks 29, two front edges of the third-type wafer cassette 90C respectively abut against still another two of the multiple limiting blocks 29, and two inner side surfaces of the third-type wafer cassette 90C respectively abut against further another two of the multiple limiting blocks 29. Thus, the third-type wafer cassette 90C can be steadily loaded onto the carrier base 11 of the body 10. The fourth-type wafer cassette 90D and the fifth-type wafer cassette 90E are loaded onto and positioned on the carrier base 11 by the multiple limiting blocks 29 in the same way as how the third-type wafer cassette 90C is loaded onto and positioned on the carrier base 11.

The third-type wafer cassette 90C, the fourth-type wafer cassette 90D, and the fifth-type wafer cassette 90E are all utilized to accommodate eight-inch wafers. When the third-type wafer cassette 90C, the fourth-type wafer cassette 90D, or the fifth-type wafer cassette 90E is loaded onto the carrier base 11, the first sensor 31 and the second sensor 32 of the sensing mechanism 30 are pressed. In such way, the load port of the present invention can tell whether the third-type wafer cassette 90C, the fourth-type wafer cassette 90D, or the fifth-type wafer cassette 90E is loaded onto the carrier base 11 or not.

With reference to FIGS. 25 to 28, the load port in accordance with the present invention is adapted for a sixth-type wafer cassette 90F and a seventh-type wafer cassette 90G with the adapter plate 50 mounted on the carrier base 11 of the body 10. With reference to FIGS. 8 to 12, to mount the adapter plate 50 on the carrier base 11, put the adapter plate 50 on the carrier base 11 and make each one of the three positioning protrusions 24 of the positioning unit 21 extend into a respective one of the three first fixing grooves 52 of the adapter plate 50. Next, the driving assembly 25 of the hooking unit 22 drives the hooking element 26 to extend out of the slide groove 12 of the carrier base 11 and extend into the second fixing groove 53 of the adapter plate 50 to hook the adapter plate 50 and position the adapter plate 50. With the positioning unit 21 and the hooking unit 22 of the positioning mechanism 20, the adapter plate 50 can be mounted on the carrier base 11 firmly.

Figure 25:
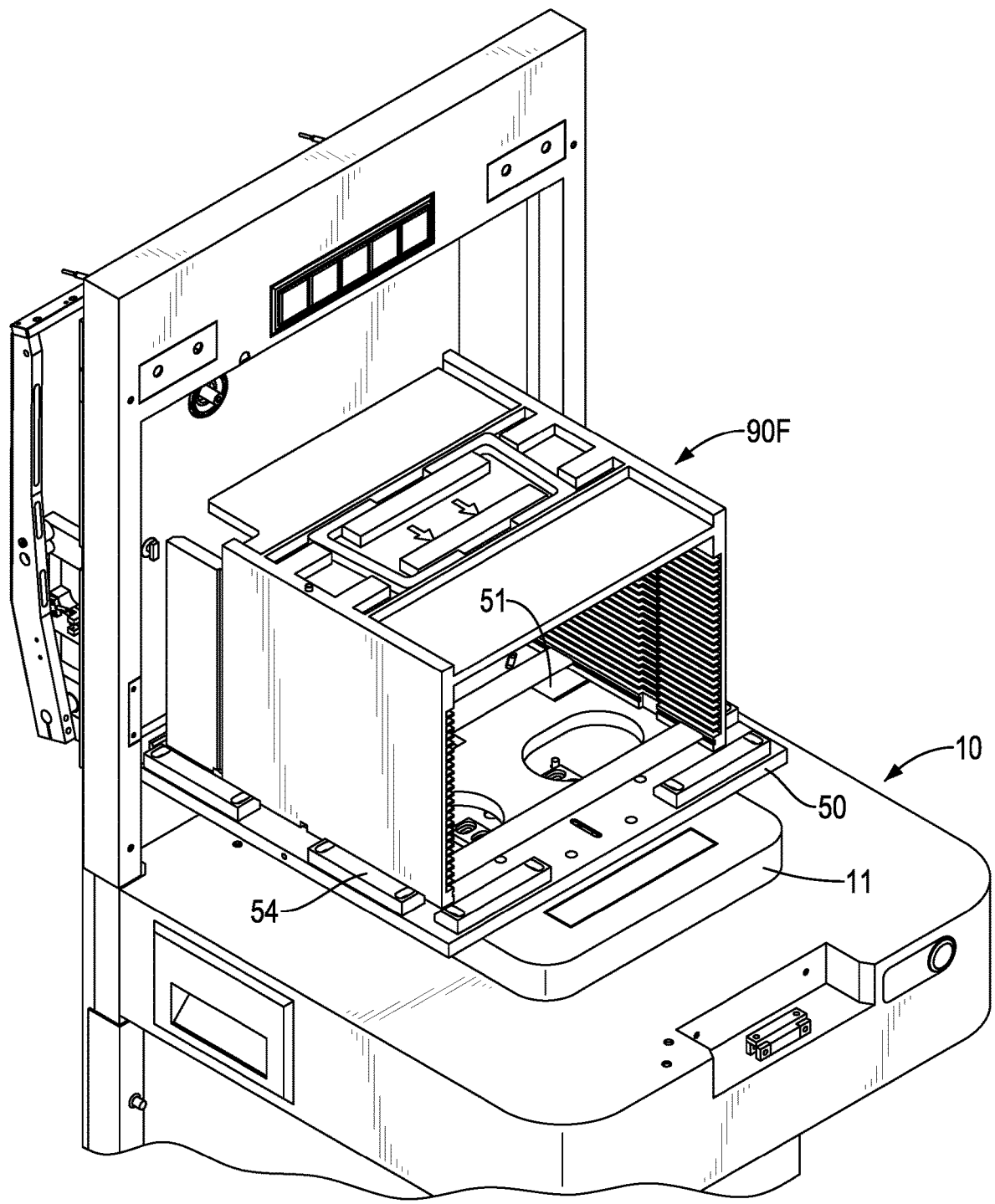
FIG. 25 is an enlarged perspective view of the load port in FIG. 1, shown with a sixth-type wafer cassette loaded onto the load port and the lid detached from the load port.
Figure 26:
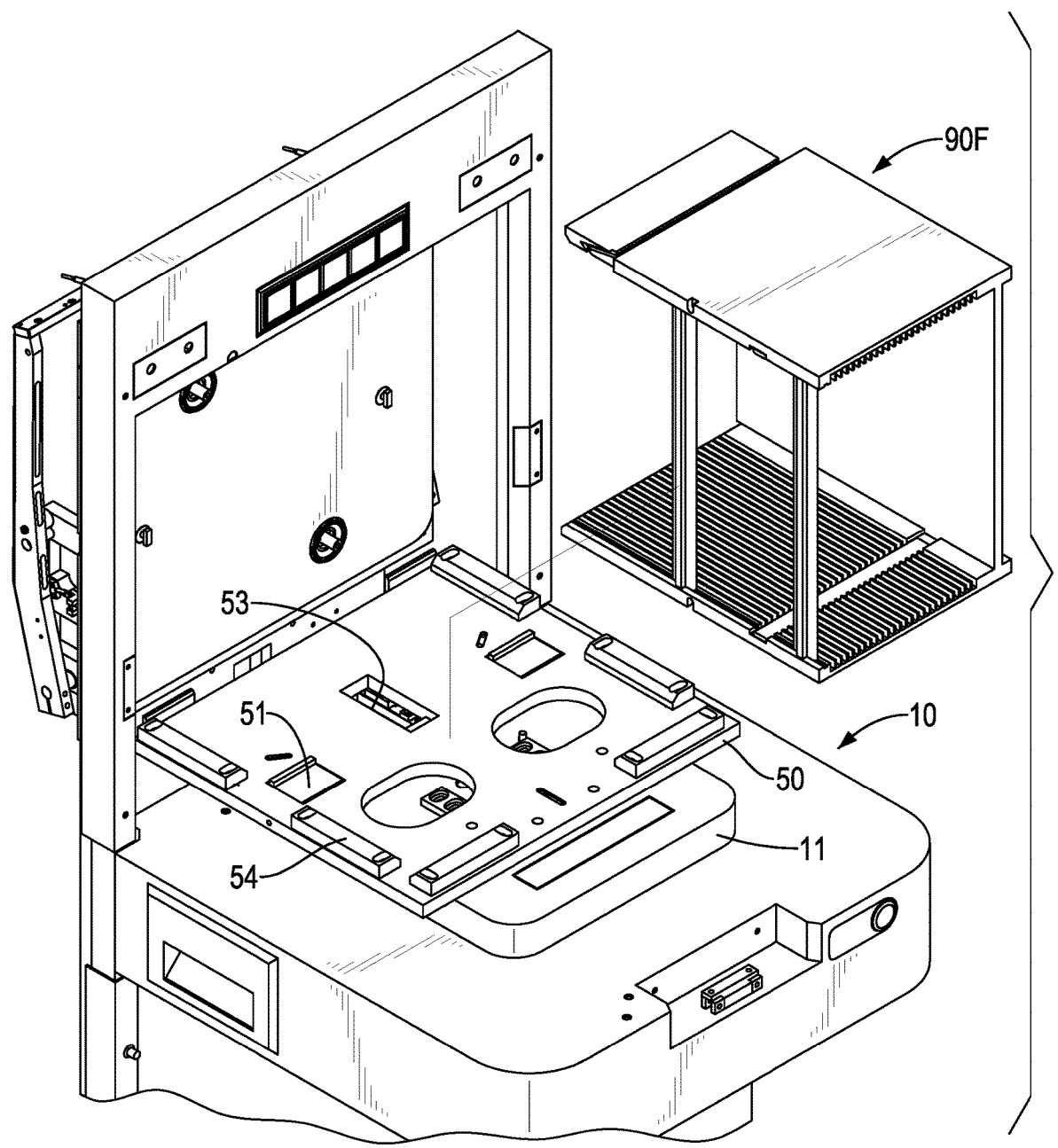
FIG. 26 is an enlarged exploded perspective view of the sixth-type wafer cassette and the load port in FIG. 25.
Figure 27:
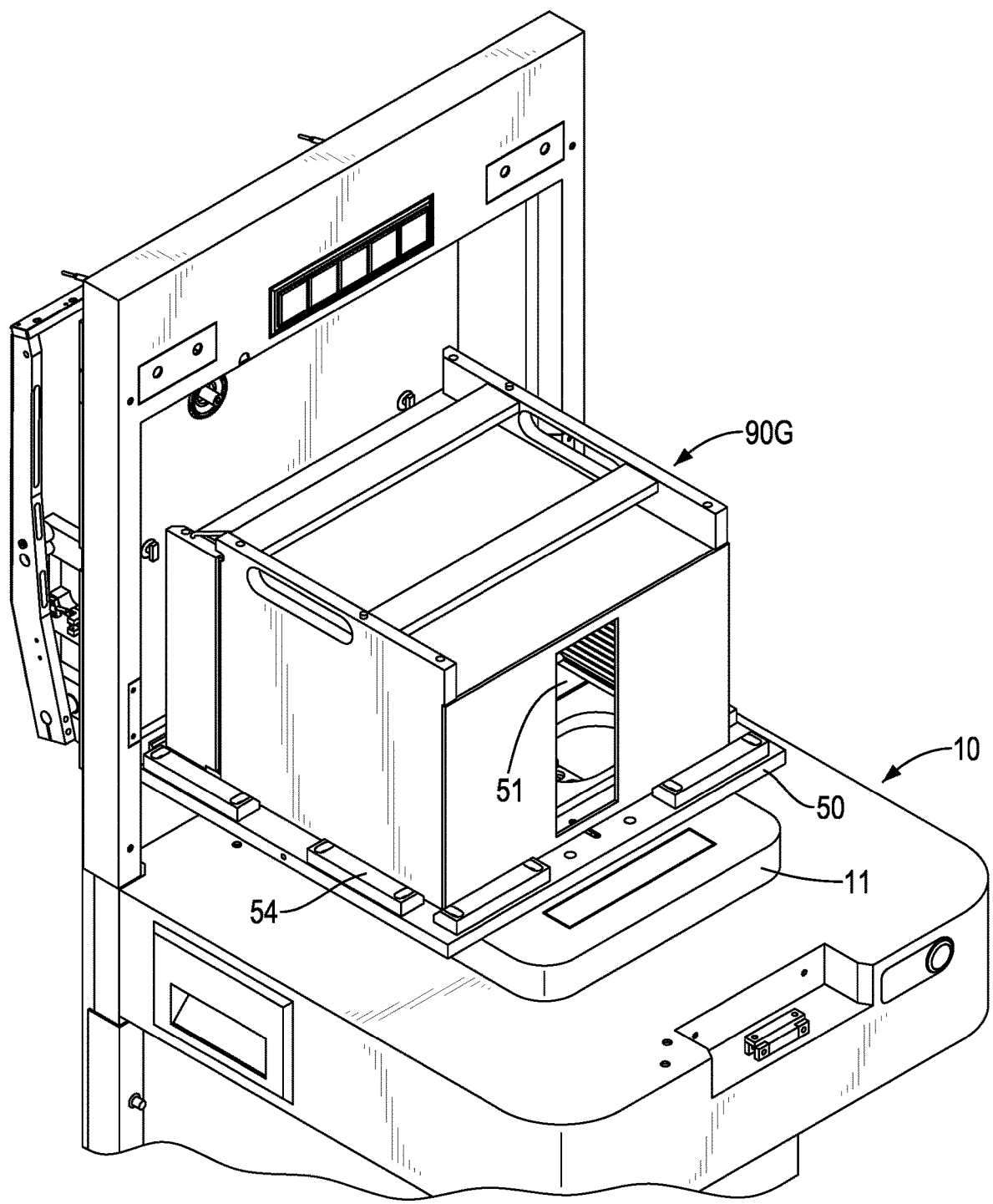
FIG. 27 is an enlarged perspective view of the load port in FIG. 1, shown with a seventh-type wafer cassette loaded onto the load port and the lid detached from the load port.
Figure 28:
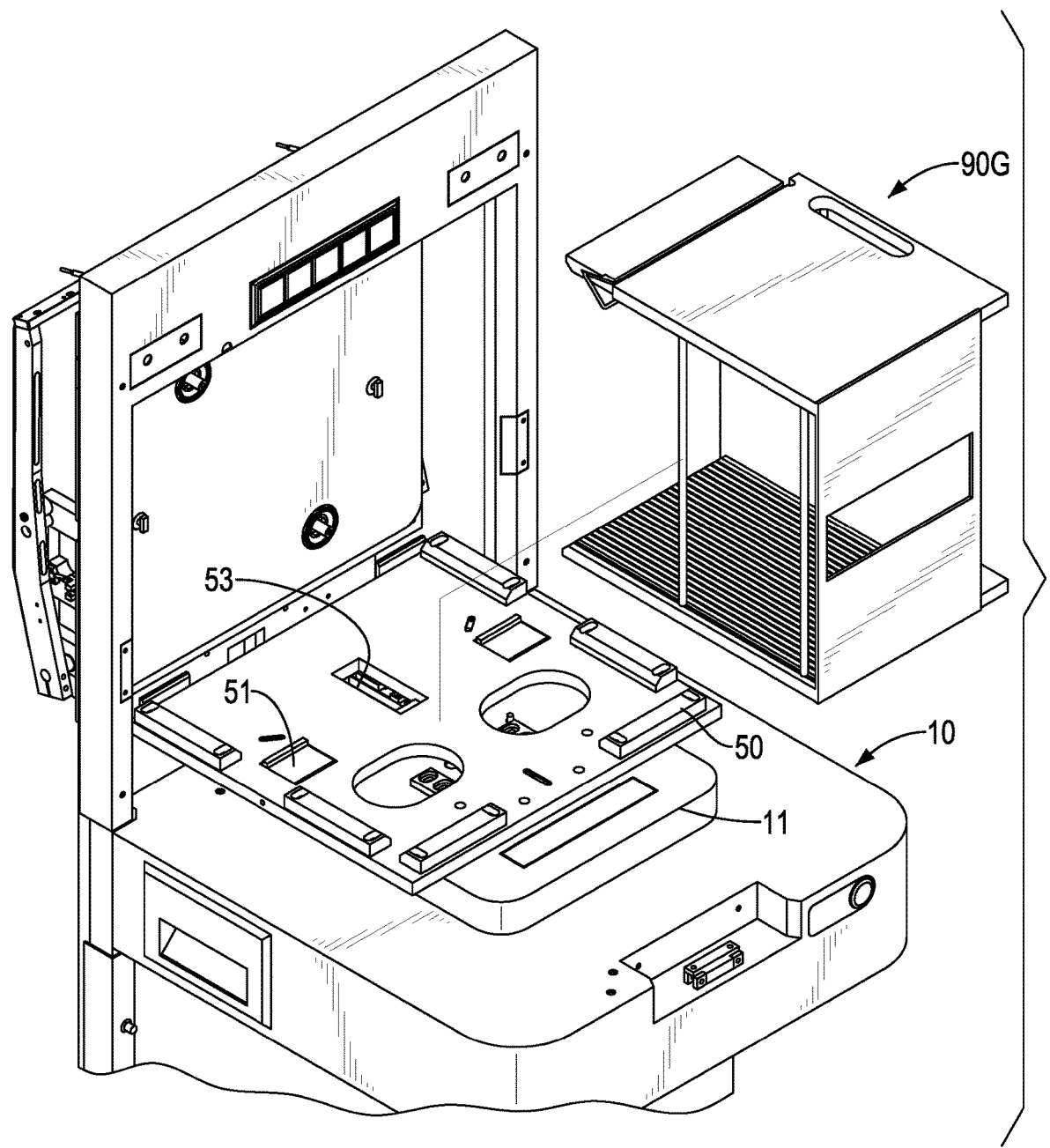
FIG. 28 is an enlarged exploded perspective view of the seventh-type wafer cassette and the load port in FIG. 27.

With reference to FIGS. 25 and 26, take the sixth-type wafer cassette 90F as an example. The sixth-type wafer cassette 90F is directly loaded onto the adapter plate 50, and the bottom edges of the sixth-type wafer cassette 90F abut against the multiple positioning blocks 54 of the adapter plate 50. The multiple positioning blocks 54 of the adapter plate 50 firmly position the sixth-type wafer cassette 90F on the adapter plate 50, so the sixth-type wafer cassette 90F is indirectly loaded onto the carrier base 11 by the adapter plate 50. With reference to FIGS. 27 and 28, similarly, the seventh-type wafer cassette 90G is positioned on the adapter plate 50 by the limitation of the multiple positioning blocks 54, and is indirectly loaded onto the carrier base 11 by the adapter plate 50.

With reference to FIGS. 9 to 11, 25, and 26, when the sixth-type wafer cassette 90F is loaded onto the adapter plate 50, the sixth-type wafer cassette 90F pushes the two pressure plates 51 of the adapter plate 50 downwardly. Then the two pressure plates 51 press on the fifth sensor 35 and the sixth sensor 36 respectively. The load port of the present invention can tell whether the sixth-type wafer cassette 90F is loaded onto the adapter plate 50. In addition to that, when the adapter plate 50 is mounted on the carrier base 11, the adapter plate 50 presses on the seventh sensor 37, the eighth sensor 38, the ninth sensor 39, and the tenth sensor 391 of the sensing mechanism 30. The load port of the present invention can tell whether the adapter plate 50 is mounted on the carrier base 11 by the detecting set for the adapter plate 50 formed by the seventh sensor 37, the eighth sensor 38, the ninth sensor 39, and the tenth sensor 391.

With the aforementioned technical features, the load port of the present invention has the following advantages.

1. The positioning unit 21, the hooking unit 22, and the limiting unit 23 of the positioning mechanism 20 enable wafer cassettes of different sizes and types to be positioned on the carrier base 11 of the body 10. Furthermore, the adapter plate 50 mounted to the carrier base 11 by the positioning unit 21 and the hooking unit 22 enables wafer cassettes that cannot be directly loaded onto the carrier base 11 to be loaded onto the adapter plate 50. In addition to the function that the wafer cassettes can be indirectly loaded onto the carrier base 11 by the adapter plate 50, the multiple positioning blocks 54 position the wafer cassettes loaded onto the adapter plate 50. Hence, the load port in accordance with the present invention is adapted for wafer cassettes of different sizes and types and practicality of the load port is thereby enhanced.

2. Furthermore, the detecting mechanism 40 has the first detecting assembly 41 and the second detecting assembly 42, and the distance between the two first detecting portions 415 of the first detecting assembly 41 is smaller than that between the two second detecting portions 425 of the second detecting assembly 42. A user can choose to use the first detecting assembly 41 or the second detecting assembly 42 according to a size of a wafer in need of detecting. Convenience in detection is thereby enhanced.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A load port adapted for wafer cassettes of different sizes and being capable of detecting storage states of wafers stored in the wafer cassettes, and the load port comprising:
   a body having
      a carrier base onto which a wafer cassette is loaded and having
         a slide groove formed through the carrier base;
      a positioning mechanism disposed on the body, positioning the wafer cassette loaded onto the carrier base, and having
         a positioning unit disposed on the carrier base of the body and having
            three positioning protrusions protruding out of a top surface of the carrier base;
         a hooking unit disposed in the body and having
            a driving assembly disposed in the body; and
            a hooking element mounted to the driving assembly, wherein the driving assembly drives the hooking element to extend out of the slide groove of the carrier base; and
         a limiting unit disposed on the top surface of the carrier base;
      a sensing mechanism disposed on the carrier base of the body; and
      a detecting mechanism disposed on the body, being on a side of the carrier base of the body, detecting the storage states of wafers stored in the wafer cassette, and having
         a first detecting assembly disposed on the body, and having
            a first driving element disposed on the body;
            a first L-shaped lever arm pivotally connected to the body;
            a first transmission element disposed on the body and connected to the first driving element and the first L-shaped lever arm; and
            a first detecting unit disposed on the first driving element and having
               two first detecting portions spaced apart from each other; and
         a second detecting assembly disposed on the body, located opposite to the first detecting assembly, and having
            a second driving element disposed on the body;
            a second L-shaped lever arm pivotally connected to the body;
            a second transmission element disposed on the body and connected to the second driving element and the second L-shaped lever arm; and
            a second detecting unit disposed on the second driving element and having
               two second detecting portions spaced apart from each other;
   wherein a distance between the two first detecting portions is smaller than a distance between the two second detecting portions.

2. The load port as claimed in claim 1, wherein the sensing mechanism has a first sensor, a second sensor, a third sensor, a fourth sensor, a fifth sensor, a sixth sensor, a seventh sensor, and an eighth sensor, and all the sensors protrude out of the top surface of the carrier base; wherein
   the first sensor and the second sensor form a detecting set for an eight-inch bare wafer;
   the third sensor, the fourth sensor, the fifth sensor, and the sixth sensor form a detecting set for a twelve-inch mounted wafer; and
   the third sensor, the fourth sensor, the fifth sensor, the sixth sensor, the seventh sensor, and the eighth sensor form a detecting set for a twelve-inch bare wafer.

3. The load port as claimed in claim 2, wherein the load port comprises an adapter plate mounted on the carrier base of the body and having
two pressure plates pivotally mounted to the adapter plate and respectively abutting against the fifth sensor and the sixth sensor of the sensing mechanism, wherein
the fifth sensor and the sixth sensor form a detecting set for an eight-inch mounted wafer; and
each one of the three positioning protrusions of the positioning unit extends into the adapter plate, and the hooking unit hooks the adapter plate.

4. The load port as claimed in claim 3, wherein the sensing mechanism has a ninth sensor and a tenth sensor both protruding out of the top surface of the carrier base; wherein the seventh sensor, the eighth sensor, the ninth sensor, and the tenth sensor form a detecting set for the adapter plate.

5. The load port as claimed in claim 3, wherein the adapter plate has multiple positioning blocks disposed on a top surface of the adapter plate and arranged at spaced intervals.

6. The load port as claimed in claim 1, wherein the driving assembly has
a lateral driver disposed in the body; and
a vertical driver mounted to the lateral driver; wherein the hooking element is mounted to the vertical driver;
a lateral displacement of the vertical driver is controlled by the lateral driver; and
a vertical displacement of the hooking element is controlled by the vertical driver.

7. The load port as claimed in claim 2, wherein the driving assembly has
a lateral driver disposed in the body; and
a vertical driver mounted to the lateral driver; wherein the hooking element is mounted to the vertical driver;
a lateral displacement of the vertical driver is controlled by the lateral driver; and
a vertical displacement of the hooking element is controlled by the vertical driver.

8. The load port as claimed in claim 3, wherein the driving assembly has
a lateral driver disposed in the body; and
a vertical driver mounted to the lateral driver; wherein the hooking element is mounted to the vertical driver;
a lateral displacement of the vertical driver is controlled by the lateral driver; and
a vertical displacement of the hooking element is controlled by the vertical driver.

9. The load port as claimed in claim 1, wherein the load port has a lid mounted to the body and covering the carrier base of the body.

10. The load port as claimed in claim 2, wherein the load port has a lid mounted to the body and covering the carrier base of the body.

11. The load port as claimed in claim 3, wherein the load port has a lid mounted to the body and covering the carrier base of the body.

12. The load port as claimed in claim 1, wherein the body has
an opening formed on the body;
an actuator disposed in the body; and
a mounting base mounted to the body and located on a side of the opening;
wherein the actuator moves the mounting base to cover the opening or leave the opening uncovered.

13. The load port as claimed in claim 2, wherein the body has
an opening formed on the body;
an actuator disposed in the body; and
a mounting base mounted to the body and located on a side of the opening;
wherein the actuator moves the mounting base to cover the opening or leave the opening uncovered.

14. The load port as claimed in claim 3, wherein the body has
an opening formed on the body;
an actuator disposed in the body; and
a mounting base mounted to the body and located on a side of the opening;
wherein the actuator moves the mounting base to cover the opening or leave the opening uncovered.

15. The load port as claimed in claim 12, wherein the detecting mechanism is disposed on the mounting base.

16. The load port as claimed in claim 13, wherein the detecting mechanism is disposed on the mounting base.

17. The load port as claimed in claim 1, wherein the load port has a displacement adjustment assembly disposed on the body and mounted to the carrier base of the body, and the carrier base moves along with the displacement adjustment assembly.

18. The load port as claimed in claim 2, wherein the load port has a displacement adjustment assembly disposed on the body and mounted to the carrier base of the body, and the carrier base moves along with the displacement adjustment assembly.

19. The load port as claimed in claim 17, wherein the displacement adjustment assembly has
a motor mounted on the body;
a lead screw mounted to the motor; and
a slide block fixed on a bottom surface of the carrier base and mounted to the lead screw;
wherein a displacement of the lead screw is controlled by the motor.

20. The load port as claimed in claim 1, wherein
the first transmission element and the second transmission element are both belt drives;
the first driving element has
a pneumatic cylinder disposed on the body; and
a clamping arm mounted to the pneumatic cylinder of the first driving element and clamping the first transmission element as a belt drive, and a displacement of the clamping arm of the first driving element being controlled by the pneumatic cylinder of the first driving element;
the second driving element has
a pneumatic cylinder disposed on the body; and
a clamping arm mounted to the pneumatic cylinder of the second driving element and clamping the second transmission element as a belt drive, and a displacement of the clamping arm of the second driving element being controlled by the pneumatic cylinder of the second driving element.

* * * * *